US012765241B2

(12) United States Patent
Ahn

(10) Patent No.: US 12,765,241 B2
(45) Date of Patent: Oct. 13, 2026

(54) ORGANIC LIGHT EMITTING DISPLAY APPARATUS

(71) Applicant: LG Display Co., Ltd., Seoul (KR)

(72) Inventor: JiYoung Ahn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 503 days.

(21) Appl. No.: 18/397,392

(22) Filed: Dec. 27, 2023

(65) Prior Publication Data

US 2024/0260422 A1 Aug. 1, 2024

(30) Foreign Application Priority Data

Jan. 30, 2023 (KR) ........................ 10-2023-0012095

(51) Int. Cl.

| | |
|---|---|
| ***H10K 59/80*** | (2023.01) |
| ***H10K 59/127*** | (2023.01) |
| ***H10K 59/35*** | (2023.01) |
| *H10K 102/00* | (2023.01) |

(52) U.S. Cl.

CPC ......... *H10K 59/879* (2023.02); *H10K 59/127* (2023.02); *H10K 59/351* (2023.02); *H10K 59/87* (2023.02); *H10K 2102/351* (2023.02)

(58) Field of Classification Search

CPC .... H10K 59/879; H10K 59/87; H10K 59/351; H10K 59/127; H10K 2102/351

See application file for complete search history.

(56) References Cited

U.S. PATENT DOCUMENTS

2006/0125388 A1* 6/2006 Song ...................... H05B 33/14 313/506
2017/0125742 A1* 5/2017 Park ................. H10K 59/80515
2022/0140291 A1* 5/2022 Kim ..................... H10K 59/122 257/40
2022/0199680 A1* 6/2022 Lee ...................... H10H 20/831
2022/0199681 A1* 6/2022 Lee ...................... H10H 20/831

* cited by examiner

*Primary Examiner* — Peniel M Gumedzoe

(74) *Attorney, Agent, or Firm* — Morgan, Lewis & Bockius LLP

(57) ABSTRACT

An organic light emitting display apparatus includes a plurality of pixels on a substrate, each including a plurality of subpixels each including an emission area, a planarization layer including a light extraction pattern which is at the emission area of each of the plurality of subpixels and includes a plurality of concave portions and a convex portion surrounding each of the plurality of concave portions, a light emitting device layer on the light extraction pattern, and a phase grating portion between the substrate and the light extraction pattern to overlap the emission area of each of the plurality of subpixels.

25 Claims, 12 Drawing Sheets

ORGANIC LIGHT EMITTING DISPLAY APPARATUS

CROSS-REFERENCE TO RELATED APPLICATIONS

This application claims the benefit of the Korean Patent Application No. 10-2023-0012095 filed on Jan. 30, 2023, which is hereby incorporated by reference as if fully set forth herein.

BACKGROUND

Technical Field

The present disclosure relates to an organic light emitting display apparatus which may increase internal light extraction efficiency and may decrease a reflectance by external light.

Discussion of the Related Art

An organic light emitting display apparatus has a high response speed and has low power consumption. Unlike a liquid crystal display device, the organic light emitting display apparatus is a self-emissive display apparatus and does not require a separate light source. Thus, there is no problem in the viewing angle, whereby the organic light emitting display apparatus is subject to a next generation flat panel display apparatus.

The organic light emitting display apparatus displays an image through light emission of an organic light emitting layer including an emission layer interposed between two electrodes.

However, since some of the light emitted from the organic emission layer is not emitted to the outside due to total reflection or the like at the interface between the organic light emitting layer and the electrode and/or total reflection at the interface between the substrate and the air layer, the light extraction efficiency is reduced. Accordingly, in the organic light emitting display apparatus, research for improving in that brightness is reduced due to low light extraction efficiency, and power consumption in increased.

SUMMARY

Accordingly, embodiments of the present disclosure are directed to an organic light emitting display apparatus that substantially obviates one or more problems due to limitations and disadvantages of the related art.

An aspect of the present disclosure is to provide an organic light emitting display apparatus that may enhance light extraction efficiency of light that is emitted from an emission layer.

Another aspect of the present disclosure is to provide an organic light emitting display apparatus in which a black visibility characteristic or a black color (or black rising) phenomenon caused by the reflection of external light may be reduced and the occurrence of rainbow Mura and circular ring Mura may be minimized or reduced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts of the present disclosure, as embodied and broadly described herein, in one or more aspects, an organic light emitting display apparatus comprises a plurality of pixels on a substrate, each including a plurality of subpixels each including an emission area, a planarization layer including a light extraction pattern which is at the emission area of each of the plurality of subpixels and includes a plurality of concave portions and a convex portion surrounding each of the plurality of concave portions, a light emitting device layer on the light extraction pattern, and a phase grating portion between the substrate and the light extraction pattern to overlap the emission area of each of the plurality of subpixels.

Specific details according to various examples of the present specification other than the means for solving the above-mentioned problems are included in the description and drawings below.

An organic light emitting display apparatus according to the present disclosure may enhance the light extraction efficiency of light emitted from an organic emission layer, and thus, may implement high efficiency and high luminance to extend a lifetime of the organic emission layer and may decrease power consumption, thereby implementing low power.

Moreover, in an organic light emitting display apparatus according to the present disclosure, a black visibility characteristic or a black color (or black rising) phenomenon caused by the reflection of external light may be reduced, and the occurrence of rainbow Mura and circular ring Mura may be minimized or reduced, thereby implementing real black in a non-driving or off state.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure and together with the description serve to explain principles of the disclosure.

DETAILED DESCRIPTION

Figure 1:
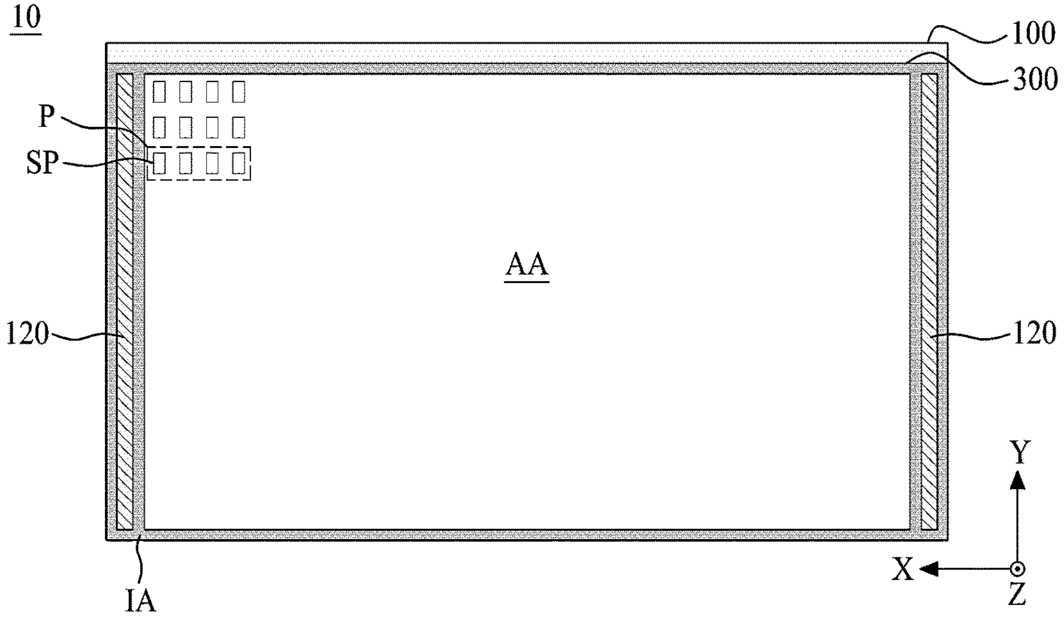
FIG. 1 is a diagram for describing an organic light emitting display apparatus according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present disclosure are used, another part can be added unless 'only-' is used. The terms in a singular form may include plural forms unless noted to the contrary.

In construing an element, the element is construed as including an error range although there is no explicit description.

In describing a positional relationship, for example, when a position relation between two parts is described as 'on', 'over', 'under', and 'next', one or more other parts may be disposed between the two parts unless a more limiting term, such as "just" or "direct(ly)" is used.

Spatially relative terms, such as "below," "beneath," "lower," "above," "upper," and the like, may be used to easily describe the relationship of one element or elements and another element or elements as illustrated in the drawings.

Spatially relative terms may be understood as terms including different directions of the device in use or operation, in addition to the direction illustrated in the drawings. For example, when the device in the drawings is turned over, elements described as "below" or "beneath" of other elements may be placed "above" of other elements. Thus, the exemplary term "below" or "beneath" may include both a downward direction and an upward direction.

It will be understood that, although the terms "first", "second", and the like can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

In describing elements of the present disclosure, the terms "first", "second", "A", "B", "(a)", "(b)", etc. may be used. These terms are intended to identify the corresponding elements from the other elements, and basis, order, or number of the corresponding elements should not be limited by these terms. The expression that an element or a layer is "connected", "coupled" or "adhered" to another element or layer means the element or layer can not only be directly connected or adhered to another element or layer, but also be indirectly connected or adhered to another element or layer with one or more intervening elements or layers "disposed" or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in a co-dependent relationship.

Hereinafter, embodiments of the present disclosure will be described in detail with reference to the accompanying drawings. For convenience of description, a scale of each of elements shown in the accompanying drawings differs from a real scale, and thus, is not limited to a scale shown in the drawings.

FIG. 1 is a diagram for describing an organic light emitting display apparatus according to an embodiment of the present disclosure.

Referring to FIG. 1, the organic light emitting display apparatus according to an embodiment of the present disclosure may comprise a display panel 10 including a substrate 100 and a counter substrate 300 bonded to each other.

The substrate 100 includes a thin film transistor, and the substrate 100 may be a transparent glass substrate or a transparent plastic substrate. The substrate 100 may include a display area AA and a non-display area IA.

The display area AA is an area for displaying an image. The display area AA may be a pixel array area, an active area, a pixel array portion, or a screen. The display area AA may include a plurality of pixels P.

The plurality of pixels P may be disposed along a first direction X and a second direction Y crossing the first direction X. The plurality of pixels P may each be defined as a unit area from which light is actually emitted. Each of the plurality of pixels P may include a plurality of adjacent subpixels SP. For example, the first direction X may be a first lengthwise direction, a long-side lengthwise direction, a widthwise direction, or a first horizontal direction of the substrate 100. The second direction Y may be a second lengthwise direction, a short-side lengthwise direction, a lengthwise direction, a second horizontal direction, or a vertical direction of the substrate 100

The non-display area IA is an area in which an image is not displayed. The non-display area IA may be a peripheral circuit area, a signal supply area, a non-active area, or a bezel area. The non-display area IA may be configured to surround the display area AA. The display panel 10 or substrate 100 may further include a peripheral circuit portion 120 disposed at the non-display area IA. The peripheral circuit portion 120 may include a gate driving circuit connected with a plurality of subpixels SP.

The counter substrate (or opposite substrate) 300 may be configured to overlap the display area AA. The counter substrate 300 may be disposed to be opposite-bonded to the substrate 100 by an adhesive member (or a transparent adhesive), or may be provided as a type where an organic material or an inorganic material is stacked on the substrate 100. The counter substrate 300 may be an upper substrate, a second substrate, or an encapsulation substrate and may encapsulate the substrate 100.

Figure 2:
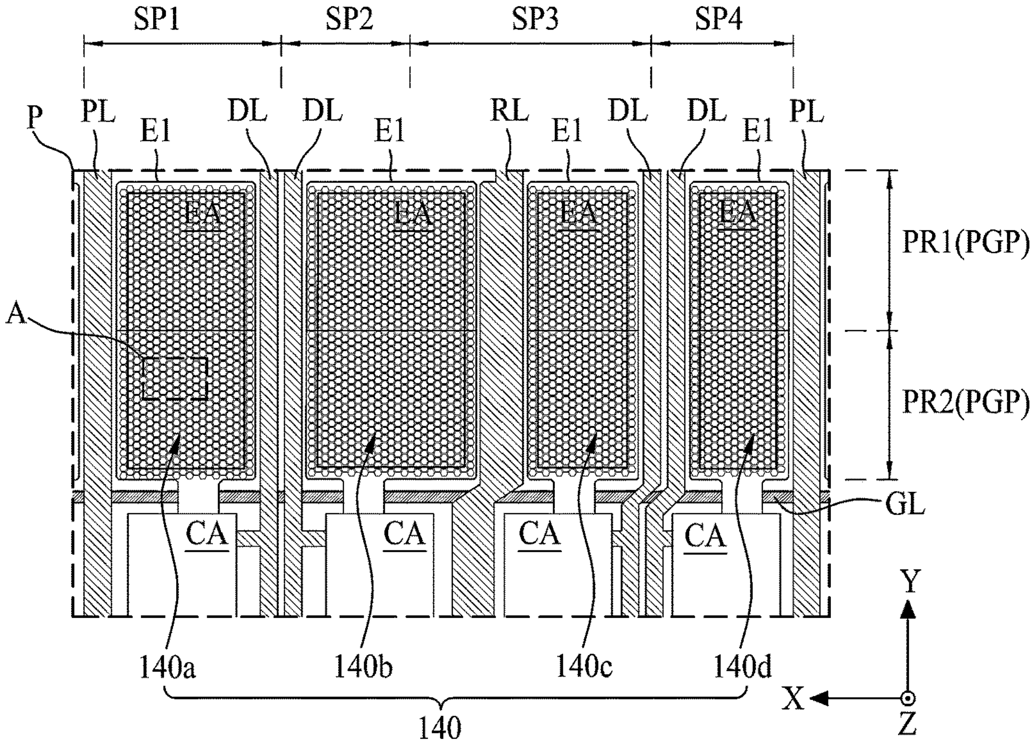
FIG. 2 is a plan view illustrating a pixel according to an embodiment of the present disclosure.

FIG. 2 is a plan view illustrating a pixel according to an embodiment of the present disclosure. FIG. 2 illustrates a plan structure of a pixel shown in FIG. 1.

Referring to FIGS. 1 and 2, in the organic light emitting display apparatus (or display panel 10) according to an embodiment of the present disclosure, each of the plurality of pixel P may include a plurality of subpixels SP, e.g., four subpixels SP1, SP2, SP3, and SP4.

Each of the plurality of pixel P according to an embodiment of the present disclosure may include first to fourth subpixels SP1, SP2, SP3, and SP4 adjacent to each other along the first direction X. For example, each of the plurality of pixels P may include a first subpixel SP1 of red, a second subpixel SP2 of white, a third subpixel SP3 of blue, and a fourth subpixel SP4 of green, but embodiments according to present disclosure are not limited thereto. Each of the first to fourth subpixels SP1, SP2, SP3, and SP4 may be configured to have different sizes (or areas) from each other.

Each of the subpixels SP (e.g, the first to fourth subpixels SP1, SP2, SP3, and SP4) may include an emission area EA and a circuit area CA. The emission area EA may be disposed on one side (or an upper side) of the subpixel area. The emission area EA of each of the first to fourth subpixels SP1, SP2, SP3, and SP4 may have different sizes (or areas) from each other. For example, the emission area EA may be an opening region or a light emitting region.

The emission area EA of each of the first to fourth subpixels SP1, SP2, SP3, and SP4 may have different sizes (or areas) from each other along the first direction X. According to an embodiment of the present disclosure, the emission area EA of the second subpixel SP2 may have the largest size, the emission area EA of the fourth subpixel SP4 may have the smallest size, the emission area EA of the first subpixel SP1 may be a smaller than the emission area EA of the second subpixel SP2, and the emission area EA of the first subpixel SP1 may be a larger than the emission area EA of each of the third and fourth subpixels SP3 and SP4. Moreover, the emission area EA of the third subpixel SP3 may have a larger size than the emission area EA of the fourth subpixel SP4. However, embodiments according to present disclosure are not limited thereto.

The circuit area CA of each of the first to fourth subpixels SP1, SP2, SP3, and SP4 may be spatially separated from the emission area EA within the subpixel area SPA. For example, the circuit area CA may be disposed at the other side (or a lower side) of the subpixel area SPA, but embodiments according to present disclosure are not limited thereto. For example, at least a portion of the circuit area CA may overlap the emission area EA within the subpixel area SPA. For example, the circuit area CA may overlap an entire emission area EA within the subpixel area SPA or may be disposed below (or under) the emission area EA within the subpixel area SPA. For example, the circuit area CA may be a non-emission area or a non-opening region.

Each of the plurality of pixel P according to another embodiment of the present disclosure may further include a light transmitting portion (or a transparent portion) disposed around at least one of the emission area EA and the circuit area CA of each of the first to fourth subpixels SP1, SP2, SP3, and SP4. For example, each of the plurality of pixel P may include an emission area for subpixel corresponding to each of the plurality of subpixels SP1, SP2, SP3, and SP4, and the light transmitting portion disposed around each of the plurality of subpixels SP1, SP2, SP3, and SP4, in this case, the organic light emitting display apparatus may implement a transparent light emitting display apparatus due to light transmission of the light transmitting portion.

According to an embodiment of the present disclosure, two data lines DL extending in parallel to each other along the second direction Y may be disposed between the first subpixel SP1 and the second subpixel SP2 and between the third subpixel SP3 and the fourth subpixel SP4, respectively. A gate line GL extending along the first direction X may be disposed between the emission area EA and the circuit area CA in each of the first to fourth subpixels SP1, SP2, SP3, and SP4. A pixel power line PL extending along the second direction Y may be disposed at one side of the first subpixel SP1 or the fourth subpixel SP4. A reference line RL extending along the second direction Y may be disposed between the second subpixel SP2 and the third subpixel SP3. The reference line RL may be used as a sensing line for externally sensing a variation in characteristics of a driving thin film transistor disposed in the circuit area CA of the pixel P and/or a variation in characteristics of a light emitting device layer disposed at the circuit area CA in a sensing driving mode of the pixel P.

Each of the subpixels SP (e.g., the first to fourth subpixels SP1, SP2, SP3, and SP4) of the plurality of pixel P according to an embodiment of the present disclosure may include a light extraction pattern 140.

The light extraction pattern 140 may be disposed at the emission area EA of each of the subpixels SP (e.g., the first to fourth subpixels SP1, SP2, SP3, and SP4) of the plurality of pixel P. The light extraction pattern 140 may be formed or configured to have a flexural (or concave-convex) shape. The light extraction pattern 140 may irradiate light, emitted from the emission area EA, toward a light output surface, and thus, may increase the light extraction efficiency of the light emitted from the emission area EA.

The light extraction pattern 140 may include first to fourth light extraction patterns 140*a* to 140*d*.

The first light extraction pattern 140*a* may be disposed or configured at the first subpixel SP1 of each of the plurality of pixels P. The second light extraction pattern 140*b* may be disposed or configured at the second subpixel SP2 of each of the plurality of pixels P. The third light extraction pattern 140*c* may be disposed or configured at the third subpixel SP3 of each of the plurality of pixels P. The fourth light extraction pattern 140*d* may be disposed or configured at the fourth subpixel SP4 of each of the plurality of pixels P.

Each of the first to fourth light extraction patterns 140*a* to 140*d* may be formed or configured to have a flexural (or concave-convex) shape. According to an embodiment of the present disclosure, the first to fourth light extraction patterns 140*a* to 140*d* may be configured to have a same size and a same shape. According to another embodiment of the present disclosure, one or more of the first to fourth light extraction patterns 140*a* to 140*d* may be configured to have different sizes and/or different shapes.

In a non-driving or off state of the organic light emitting display apparatus or the display panel 10, external light input from the outside to the light extraction pattern 140 may be doubly reflected by the light extraction pattern 140 and may be output to the outside through the light output surface. Reflected light occurring due to the light extraction pattern 140 may cause radial-shaped circular ring Mura (or circular ring smear pattern) and/or rainbow Mura (or rainbow smear pattern) which are/is spread in a radial shape while having rainbow color, due to a dispersion characteristic of light based on a diffraction characteristic. The reflected light occurring due to the light extraction pattern 140 may cause radial-shaped circular ring Mura and/or rainbow Mura which are/is spread in a radial shape, due to the multi-interference and/or constructive interference of light caused by a difference between wavelength-based refraction angles, causing a reduction in black visibility characteristic of the organic light emitting display apparatus or the display panel 10.

According to an embodiment of the present disclosure, when the regularity of reflection light reflected from the light extraction patterns 140 of each of the plurality of pixels P is high, a probability of the occurrence of constructive interference (or light interference) occurring between reflection lights may be relatively high. Accordingly, a diffraction pattern (or diffraction pattern distribution) may occur due to the constructive interference of reflection lights. On the other hand, when the reflection light reflected from the light extraction pattern 140 of each of the plurality of pixels P is low in regularity or does not have regularity, a probability of the occurrence of constructive interference occurring between reflected lights may decrease or a probability of the occurrence of destructive interference may increase due to the irregularity of the reflection light, and thus, may prevent or minimize the occurrence of radial-shaped rainbow Mura and/or radial-shaped circular ring Mura which are/is spread in a radial shape, due to the constructive interference of reflected light.

According to an embodiment of the present disclosure, the emission area EA of each of the first to fourth subpixels SP1, SP2, SP3, and SP4 may include a phase grating portion PGP which changes a light path of reflection light reflected from the light extraction pattern 140 to decrease or minimize the regularity of the reflection light.

The phase grating portion PGP may be configured at each of the first to fourth subpixels SP1, SP2, SP3, and SP4 of each of the plurality of pixels P. For example, the phase grating portion PGP may be configured between the substrate 100 and the light extraction pattern 140 to overlap the emission area EA of each of the first to fourth subpixels SP1, SP2, SP3, and SP4 of each of the plurality of pixels P.

The organic light emitting display apparatus or the phase grating portion PGP according to an embodiment of the present disclosure may include a plurality of pattern regions PR1 and PR2 which are configured at each of the first to fourth subpixels SP1, SP2, SP3, and SP4 of each of the plurality of pixels P. For example, the phase grating portion PGP or each of the first to fourth subpixels SP1, SP2, SP3, and SP4 of each of the plurality of pixels P may include the plurality of pattern regions PR1 and PR2 configured between the light extraction pattern 140 and the substrate 100. For example, the phase grating portion PGP or the emission area EA of each of the first to fourth subpixels SP1, SP2, SP3, and SP4 configured at each of the plurality of pixels P may include the plurality of pattern regions PR1 and PR2 configured between the light extraction pattern 140 and the substrate 100. For example, the plurality of pattern regions PR1 and PR2 may be disposed along one direction of the first direction X, the second direction Y, and a diagonal direction between the first direction X and the second direction Y within the emission area EA of a corresponding subpixel SP1, SP2, SP3, and SP4. For example, the plurality of pattern regions PR1 and PR2 may be alternately disposed along one direction of the first direction X, the second direction Y, and the diagonal direction between the first direction X and the second direction Y within the emission area EA of a corresponding subpixel SP1, SP2, SP3, and SP4.

The organic light emitting display apparatus or the phase grating portion PGP according to an embodiment of the present disclosure may include a plurality of pattern regions, such as a first pattern region PR1 and a second pattern region PR2 as shown in FIG. 2, which are configured at each of the first to fourth subpixels SP1, SP2, SP3, and SP4 of each of the plurality of pixels P. For example, the phase grating portion PGP or each of the first to fourth subpixels SP1, SP2, SP3, and SP4 configured at each of the plurality of pixels P may include the first pattern region PR1 and the second pattern region PR2 configured between the light extraction pattern 140 and the substrate 100. For example, the phase grating portion PGP or the emission area EA of each of the first to fourth subpixels SP1, SP2, SP3, and SP4 configured at each of the plurality of pixels P may include the first pattern region PR1 and the second pattern region PR2 configured between the light extraction pattern 140 and the substrate 100.

The first pattern region PR1 and the second pattern region PR2 may be separated or spatially separated from each other within the emission area EA of a corresponding subpixel SP1, SP2, SP3, and SP4. The first pattern region PR1 and the second pattern region PR2 may be disposed along one direction of the first direction X, the second direction Y, and a diagonal direction between the first direction X and the second direction Y within the emission area EA of a corresponding subpixel SP1, SP2, SP3, and SP4. For example, the first pattern region PR1 and the second pattern region PR2 may be disposed along the second direction Y. For example, the first pattern region PR1 and the second pattern region PR2 may include first and second division regions of a subpixel spatially divided along the second direction Y.

According to an embodiment of the present disclosure, the phase grating portion PGP may be a phase grating part, a phase grating, a phase grating pattern, a multi-domain, or a subdomain. For example, the first pattern region PR1 may be a phase delay region, a phase delay pattern layer, a light path delay region, a light path delay pattern layer, a light refraction region, a light refraction pattern region, or an insulation film pattern layer. For example, the second pattern region PR2 may be a phase non-delay region, a light path non-delay region, a light non-refraction region, a phase non-delay layer, a light path non-delay layer, a light non-refraction layer, a slit, a slot, or a groove.

According to an embodiment of the present disclosure, the plurality of pattern regions PR1 and PR2 or the first pattern region PR1 and the second pattern region PR2 may be configured to change a light path and/or a phase of reflection light reflected from the light extraction pattern 140 based on a refractive index difference and/or a dielectric constant difference. For example, the plurality of pattern regions PR1 and PR2 have a refractive index difference therebetween. For example, the plurality of pattern regions PR1 and PR2 have a refractive index difference of 0.1 or more therebetween. In this way, the plurality of pattern regions PR1 and PR2 or the first pattern region PR1 and the second pattern region PR2 may decrease or minimize the regularity of the reflection light reflected from the light extraction pattern 140 to increase the randomness of the reflection light, and thus, may reduce a probability of occurrence of constructive interference (or light interference) occurring between reflection lights or may increase a probability of occurrence of destructive interference.

Therefore, the irregularity or randomness of a diffraction pattern of reflection light reflected from the light extraction pattern 140 may increase based on the plurality of pattern regions PR1 and PR2 or the first pattern region PR1 and the second pattern region PR2, and thus, the occurrence of rainbow Mura where reflection light is spread in a radial shape and/or circular ring Mura where reflection light is spread in a radial shape may be prevented or minimized based on the diffraction characteristic of the reflection light reflected from the light extraction pattern 140 at the display area AA. For example, a black visibility characteristic or a black color (or black rising) phenomenon caused by the reflection of external light may be reduced in a non-driving or off state of the organic light emitting display apparatus or the display panel 10, thereby implementing real black.

Figure 3:
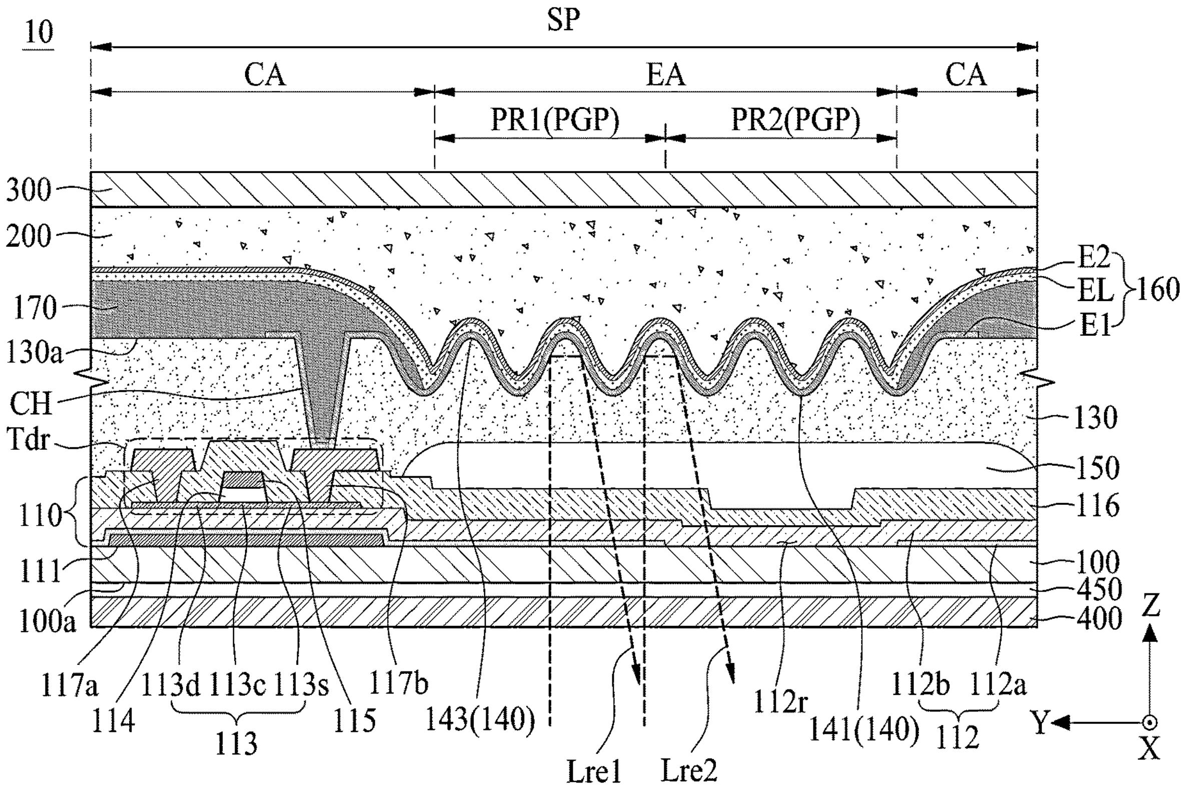
FIG. 3 is a cross-sectional view illustrating a cross-sectional structure of one subpixel according to an embodiment of the present disclosure.

FIG. 3 is a cross-sectional view illustrating a cross-sectional structure of one subpixel according to an embodiment of the present disclosure.

Referring to FIGS. 2 and 3, the organic light emitting display apparatus or display panel 10 according to an embodiment of the present disclosure may comprise a substrate 100.

A thin film transistor may be formed on the substrate 100. The substrate 100 may be a first substrate, a base substrate, a lower substrate, a transparent glass substrate, a transparent plastic substrate, or a base member.

A pixel circuit layer 110, a planarization layer 130, and a light emitting device layer 160 may be formed on the substrate 100. The pixel circuit layer 110 may include a buffer layer 112 and a pixel circuit corresponding to the plurality of pixels P.

The organic light emitting display apparatus or display panel 10 according to an embodiment of the present disclosure may further comprise an insulation layer disposed between the substrate 100 and the light extraction pattern 140. The buffer layer 112 may be disposed at an entirety of an opposite surface of a first surface (or a front surface, which is referred to as a light extraction surface hereafter) 100*a* of the substrate 100. The buffer layer 112 may be an insulation layer, an insulating material layer, or an inorganic insulation layer. The buffer layer 112 may prevent or at least reduce materials contained in the substrate 100 from spreading to a transistor layer during a high-temperature process in the manufacturing of the thin film transistor, or may prevent external water or moisture from permeating into the light emitting device layer 160.

The pixel circuit may include a driving thin film transistor Tdr disposed at a circuit area CA of each subpixel SP of the plurality of pixel P. The driving thin film transistor Tdr may include an active layer 113, a gate insulating layer 114, a gate electrode 115, a passivation layer 116, a drain electrode 117*a*, and a source electrode 117*b*.

The active layer 113 may be disposed on (or over) the buffer layer 112. The active layer 113 may be configured with a semiconductor material based on any one of amorphous silicon, polycrystalline silicon, oxide, and organic materials. The active layer 113 may include a channel region 113*c*, a drain region 113*d*, and a source region 113*s*.

The gate insulating layer 114 may be formed at an island shape on (or over) the channel region 113*c* of the active layer 113, or may be formed on (or over) the entire front surface of the buffer layer 112 or substrate 100 including the active layer 113.

The gate electrode 115 may be disposed on (or over) the gate insulating layer 114 to overlap the channel region 113*c* of the active layer 113.

The passivation layer 116 may be formed on (or over) the gate electrode 115, and the drain region 113*d* and the source region 113*s* of the active layer 113. The passivation layer 116 may be formed at an entire front surface of the buffer layer 112. For example, the passivation layer 116 may be formed between the buffer layer (the insulation layer) 112 and the light extraction pattern 140. For example, the passivation layer 116 may be configured with an inorganic material. For example, the passivation layer 116 may be an interlayer insulating layer.

The drain electrode 117*a* may be disposed on (or over) the passivation layer 116 to be electrically connected to the drain region 113*d* of the active layer 113. The source electrode 117*b* may be disposed on (or over) the passivation layer 116 to be electrically connected to the source region 113*s* of the active layer 113.

The pixel circuit may further include at least one capacitor and at least one switching thin film transistors which are disposed at the circuit area CA together with the driving thin film transistor Tdr.

The organic light emitting display apparatus according to an embodiment of the present disclosure may further include a light shielding layer 111 provided below (or under) at least one active layer 113 of the driving thin film transistor Tdr, a first switching thin film transistor, and a second switching thin film transistor. The light shielding layer 111 may be configured to reduce or prevent a change in a threshold voltage of the thin film transistor caused by external light.

The planarization layer 130 may be provided over the pixel circuit layer 110. The planarization layer 130 may be formed at the entire display area AA and the remaining portions of the non-display area IA except the pad area. For example, the planarization layer 130 may include an extension portion (or expansion portion) extended or expanded from the display area AA to the remaining portions of the non-display area IA except the pad area. Accordingly, the planarization layer 130 may have a relatively large size than the display area AA.

The planarization layer 130 according to an embodiment of the present disclosure may be formed to have a relatively large thickness so that the planarization layer 130 may provide a planarized surface 130*a* over the pixel circuit layer 110. For example, the planarization layer 130 may be formed of an organic material such as one of photo acrylic, benzocyclobutene, polyimide, and fluorine resin, or the like.

The planarization layer 130 may include a light extraction pattern 140 disposed at each subpixel SP. The light extraction pattern 140 may be formed at the planarization layer 130 to overlap the emission area EA of each subpixel SP.

The light extraction pattern 140 may be formed at the planarization layer 130 to have a curved portion (or non-flat portion). The light extraction pattern 140 may be formed at the planarization layer 130 to have a curved shape (or an uneven shape). The light extraction pattern 140 may have a size larger than the emission area EA. For example, the light extraction pattern 140 may be a light extraction pattern, a light extraction pattern portion, a curved pattern portion, an uneven pattern portion, a micro lens, or a light scattering portion.

The light extraction pattern 140 or the first to fourth light extraction patterns 140*a*, 140*b*, 140*c*, and 140*d* according to an embodiment of the present disclosure may include a plurality of concave portions 141, and a convex portion 143 disposed around each of the plurality of concave portions 141. The convex portion 143 may be configured to surround each of the plurality of concave portions 141.

Each of the plurality of concave portions 141 may be implemented to be concave from the upper surface (or a flat surface) 130*a* of the planarization layer 130. Specifically, each of the plurality of concave portions 141 may be implemented to be concave from the upper surface 130*a* of the planarization layer 130 near a side of the light emitting device layer 160, towards a side of the pixel circuit layer 110. The plurality of concave portions 141 may have a same height with respect to the upper surface 130*a* of the planarization layer 130, but some of the plurality of concave portions 141 may have different depths. For example, a bottom surface of each of the plurality of concave portions 141 may be positioned between the upper surface 130*a* of the planarization layer 130 and the substrate 100.

The convex portion 143 may be formed to be connected to each other between the plurality of concave portions 141. The convex portion 143 may be provided at the planarization layer 130 that overlaps the emission area EA to have a shape that may maximize an external extraction efficiency of light generated from the subpixel SP based on an effective emission area of the light emitting device layer 160. The convex portion 143 may change a propagation path of light emitted from the light emitting device layer 160 toward the light extraction surface 100*a* and extracts the light totally reflected within the light emitting device layer 160 toward the light extraction surface 100*a*, and thus, degradation of the light extraction efficiency caused by the light which is trapped within the light emitting device layer 160 may prevent or minimize.

A top portion of the convex portion 143 according to an embodiment of the present disclosure may be adjacent to the light emitting device layer 160 and may have a sharp structure and a convex curved shape, so as to increase the light extraction efficiency. For example, the top portion of the convex portion 143 may include a dome or bell structure having a convex cross-sectional shape.

The convex portion 143 according to an embodiment of the present disclosure may include an inclined portion having a curved shape between a bottom portion and the top portion (or peak portion). The inclined portion of the convex portion 143 may form or configure the concave portion 141. For example, the inclined portion of the convex portion 143 may be an inclined surface or a curved portion. The inclined portion of the convex portion 143 according to an embodiment of the present disclosure may have a cross-sectional structure having Gaussian curve. In this case, the inclined portion of the convex portion 143 may have a tangent slope which increases progressively from the bottom portion to the top portion, and then decreases progressively.

The light emitting device layer 160 may be disposed on (or over) the light extraction pattern 140 overlapping the emission area EA of each subpixel SP. For example, the light emitting device layer 160 may directly contact a surface of the light extraction pattern 140.

The light emitting device layer 160 according to an embodiment of the present disclosure may include a first electrode E1, an emission layer EL, and a second electrode E2. For example, the first electrode E1, the emission layer EL, and the second electrode E2 may be configured to emit the light toward the substrate 100 according to a bottom emission type, but embodiments according to present disclosure are not limited thereto.

The first electrode E1 may be formed on (or over) the planarization layer 130, and may be electrically connected to a source electrode 117*b* (or a drain electrode 117*a*) of the driving thin film transistor Tdr. One end of the first electrode E1 which is close to the circuit area CA may be electrically connected to the source electrode 117*b* (or a drain electrode 117*a*) of the driving thin film transistor Tdr via an electrode contact hole CH provided at the planarization layer 130 and the passivation layer 116.

The first electrode E1 directly contacts the light extraction pattern 140 and thus, may have a shape conforming to the shape of the light extraction pattern 140. As the first electrode E1 is formed (or deposited) over the planarization layer 130 to have a relatively small thickness, the first electrode E1 may have a surface morphology conforming to a surface morphology of the light extraction pattern 140 including the convex portion 143 and the plurality of concave portions 141. For example, the first electrode E1 is formed in a conformal shape based on the surface shape (morphology) of the light extraction pattern 140 by a deposition process of a transparent conductive material, whereby the first electrode E1 may have a cross-sectional structure whose shape is a same as the light extraction pattern 140.

The emission layer EL may be formed on (or over) the first electrode E1 and may directly contact the first electrode E1. As the emission layer EL is formed (or deposited) on (or over) the first electrode E1 to have a relatively large thickness in comparison to the first electrode E1, the emission layer EL may have a surface morphology which is the same as or different from the surface morphology in each of the plurality of concave portions 141 and the convex portion 143 or the surface morphology of the first electrode E1. According to an embodiment of the present disclosure, the emission layer EL is formed in a conformal shape based on the surface shape (morphology) of the first electrode E1, in this case, the emission layer EL may have a cross-sectional structure whose shape is a same as the first electrode E1. According to another embodiment of the present disclosure, the emission layer EL may be formed in a non-conformal shape which does not conform to the surface shape (or morphology) of the first electrode E1, in this case, the emission layer EL may have a cross-sectional structure whose shape may be different from the first electrode E1.

The emission layer EL according to an embodiment of the present disclosure has a thickness that gradually increases toward the bottom surface of the convex portion 143 or the concave portion 141. For example, the emission layer EL may have the thinnest thickness at the inclined surface (or curved surface) between the convex portion 143 and the concave portion 141, but embodiments according to present disclosure are not limited thereto.

The emission layer EL according to an embodiment of the present disclosure includes two or more organic light emitting layers to emit white light. As an example, the emission layer EL may include a first organic light emitting layer and a second organic light emitting layer to emit white light by mixing a first light and a second light.

The second electrode E2 may be formed on (or over) the emission layer EL and may directly contact the emission layer EL. The second electrode E2 may be formed (or deposited) on (or over) the emission layer EL to have a relatively thin thickness compared to the emission layer EL. The second electrode E2 may be formed (or deposited) on (or over) the emission layer EL to have a relatively thin thickness, and thus may have a surface morphology corresponding to the surface morphology of the emission layer EL. For example, the second electrode E2 may have a cross-sectional structure whose shape may be the same as or different from the light extraction pattern 140.

The second electrode E2 according to an embodiment of the present disclosure may include a metal material having a high reflectance to reflect the incident light emitted from the emission layer EL toward the substrate 100. For example, the second electrode E2 may include a single-layered structure or multi-layered structure of any one material selected of aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba). The second electrode E2 may be a cathode electrode.

The traveling path of the light generated from the emission layer EL may change toward the light extraction surface (or a light emitting surface) 110*a* by the concave portion 141 and/or the convex portion 143 of the light extraction pattern 140, to thereby increase the external extraction efficiency of the light emitted from the emission layer EL.

The organic light emitting display apparatus or the display panel 10 according to an embodiment of the present disclosure may further include a bank layer 170. The bank layer 170 may be disposed on (or over) the planarization layer 130 and an edge portion of the first electrode E1. The bank layer 170 may be configured in a transparent material or an opaque material. For example, the bank layer 170 may be a transparent bank layer or a black bank layer. For example, the bank layer 170 may include a photosensitizer including a black pigment, in this case, the bank layer 170 may function as a light blocking member between adjacent subpixels SP.

The organic light emitting display apparatus or the display panel 10 according to an embodiment of the present disclosure may further include a color filter layer 150.

The color filter layer 150 may be disposed between the substrate 100 and the light extraction pattern 140. The color filter layer 150 may be disposed between the substrate 100 and the light extraction pattern 140 to overlap at least one emission area EA. The color filter layer 150 according to an embodiment of the present disclosure may be disposed between the passivation layer 116 and the planarization layer 130 to overlap with the emission area EA. For example, the color filter layer 150 may be disposed between the light extraction pattern 140 and the phase grating portion PGP. The color filter layer 150 according to another embodiment of the present disclosure may be disposed between the substrate 100 and the passivation layer 116.

The color filter layer 150 may have a size which is greater wider than the emission area EA. The color filter layer 150 may have a size which is greater than the emission area EA and smaller than the light extraction pattern 140 of the planarization layer 130, but embodiments according to present disclosure are not necessarily limited to thereto, and the color filter layer 150 may have a size which is greater than the light extraction pattern 140 of the planarization layer 130. For example, an edge portion of the color filter layer 150 may overlap the bank layer 170. For example, the color filter layer 150 may have a size which is greater than a size corresponding to an entire area of each subpixel SP, thereby reducing light leakage between adjacent subpixels SP.

The color filter layer 150 may be configured to transmit only the wavelength of a color set in the subpixel SP. For example, when one pixel P is configured with the first to fourth subpixels SP1, SP2, SP3, and SP4, the color filter layer 150 may include a red color filter disposed in the first subpixel SP1, a blue color filter disposed in the third subpixel SP3, and a green color filter disposed in the fourth subpixel SP4. The second subpixel SP2 may not include a color filter layer or may include a transparent material to compensate a step difference between adjacent subpixels, thereby emitting white light.

The organic light emitting display apparatus or each of the plurality of subpixels SP1, SP2, SP3, and SP4 according to an embodiment of the present disclosure may further include the phase grating portion PGP which is configured between the substrate 100 and the light extraction pattern 140 to overlap the emission area EA.

The phase grating portion PGP may be provided in each of the plurality of subpixels SP1, SP2, SP3, and SP4 and may be configured between the substrate 100 and the light extraction pattern 140 to overlap the emission area EA of each of the plurality of subpixels SP. For example, the phase grating portion PGP may be provided in each of the plurality of subpixels SP1, SP2, SP3, and SP4 and may be formed or configured at the pixel circuit layer 110 between the substrate 100 and the light extraction pattern 140 to overlap the emission area EA. For example, the phase grating portion PGP may be formed or configured at one or more insulation layers having a refractive index difference with the substrate 100 among insulation layers disposed in the pixel circuit layer 110. For example, the phase grating portion PGP may be formed or configured at one or more insulation layers having a refractive index difference of 0.1 or more with the substrate 100 among the insulation layers disposed in the pixel circuit layer 110. For example, the phase grating portion PGP may be provided in each of the plurality of subpixels SP1, SP2, SP3, and SP4 and may be formed or configured at the buffer layer 112 between the substrate 100 and the light extraction pattern 140 to overlap the emission area EA.

The phase grating portion PGP according to an embodiment of the present disclosure may include the plurality of pattern regions PR1 and PR2 or the first pattern region PR1 and the second pattern region PR2, which are provided between the substrate 100 and the light extraction pattern 140 to overlap the emission area EA. The first pattern region PR1 and the second pattern region PR2 may be disposed along the second direction Y.

The first and second pattern regions (or the plurality of pattern regions) PR1 and PR2 may be formed or configured at the buffer layer 112 between the substrate 100 and the light extraction pattern 140 to overlap the emission area EA.

The first pattern region PR1 may be formed or configured as the buffer layer 112, and the second pattern region PR2 may be formed or configured as a portion of the buffer layer 112.

The buffer layer 112 according to an embodiment of the present disclosure may include a first buffer layer 112*a* and a second buffer layer 112*b*. For example, the buffer layer 112 may include the first buffer layer 112*a* and the second buffer layer 112*b*, which have different refractive indexes and/or dielectric constants. For example, the buffer layer 112 may include the first buffer layer 112*a* and the second buffer layer 112*b* each having a refractive index difference of 0.1 or more.

The first buffer layer (or the first insulation layer) 112*a* may be disposed an entirety of an opposite surface of the first surface (or a front surface) 100*a* of the substrate 100. For example, the first buffer layer 112*a* may be disposed to cover the opposite surface of the first surface 100*a* of the substrate 100. For example, the first buffer layer 112*a* may be configured with an insulating material having a first refractive index. For example, the first buffer layer 112*a* may be a first insulation layer, a lower insulation layer, a first inorganic layer, a first inorganic insulation layer, or a lower inorganic layer. For example, the first buffer layer 112*a* may be configured as any one material of oxide silicon (SiOx), nitride silicon (SiNx), oxynitride silicon (SiONx), and oxide titanium (TiOx), but embodiments according to present disclosure are not limited thereto. For example, the first buffer layer 112*a* may be configured as the nitride silicon (SiNx).

The second buffer layer (or the second insulation layer) 112*b* may be stacked on the first buffer layer 112*a*. For example, the second buffer layer 112*b* may be disposed on (or over) the opposite surface of the first surface 100*a* of the substrate 100 to cover the first buffer layer 112*a*. The second buffer layer 112*b* may cover by the passivation layer 116. The second buffer layer 112*b* may be configured as a material which differs from that of the first buffer layer 112*a*. For example, the first buffer layer 112*a* and the second buffer layer 112*b* may be configured to have different refractive indexes and/or dielectric constants. For example, the second buffer layer 112*b* may be configured as an insulating material having a second refractive index which differs from the first refractive index. For example, the second buffer layer 112*b* may be a second insulation layer, an upper insulation layer, a second inorganic layer, a second inorganic insulation layer, or an upper inorganic layer. For example, the second buffer layer 112*b* may be configured as any one material of oxide silicon (SiOx), nitride silicon (SiNx), oxynitride silicon (SiONx), and oxide titanium (TiOx), but embodiments according to present disclosure are not limited thereto. For example, the second buffer layer 112*b* may be configured as the oxide silicon (SiOx).

The first pattern region PR1 may be configured to include all of the first buffer layer 112*a* and the second buffer layer 112*b* which are disposed between the light extraction pattern 140 and the substrate 100 to overlap the light extraction pattern 140. The first pattern region PR1 may be a multi-layer region which includes all of the first buffer layer 112*a* and the second buffer layer 112*b* stacked between the light extraction pattern 140 and the substrate 100. For example, the first pattern region PR1 may be a multi-layer region of the buffer layer 112. Accordingly, first reflection light Lre1 reflected from the light extraction pattern 140 to the first pattern region PR1 may be refracted by a refractive index difference between the first buffer layer 112*a* and the substrate 100, or may be output to the outside of the substrate 100 through a light path based on the refractive index difference between the first buffer layer 112*a* and the substrate 100.

The second pattern region PR2 may be configured to include only the second buffer layer 112*b* which is disposed between the light extraction pattern 140 and the substrate 100 to overlap the light extraction pattern 140. For example, the second pattern region PR2 may be a single-layer region including the second buffer layer 112*b* disposed in a region (referred to as a removal region hereafter) 112*r*, from which the first buffer layer 112*a* has been removed, of a region overlapping the emission area EA between the light extraction pattern 140 and the substrate 100. For example, the second pattern region PR2 may be a single-layer region of the buffer layer 112. For example, the second pattern region PR2 may be a contact region or a direct contact region between the second buffer layer 112*b* and the substrate 100 at a region overlapping the emission area EA between the light extraction pattern 140 and the substrate 100. For example, the second pattern region PR2 may be the removal region 112*r*, from which the first buffer layer 112*a* has been removed, between the light extraction pattern 140 and the substrate 100. Accordingly, second reflection light Lre2 reflected from the light extraction pattern 140 to the second pattern region PR2 may be refracted by a refractive index difference between the second buffer layer 112*b* and the substrate 100, or may be output to the outside of the substrate 100 through a light path based on the refractive index difference between the second buffer layer 112*b* and the substrate 100.

According to an embodiment of the present disclosure, the first reflection light Lre1 reflected from the light extraction pattern 140 to the first pattern region PR1 and second reflection light Lre2 reflected from the light extraction pattern 140 to the second pattern region PR2 may have a phase difference and/or a light path difference therebetween, and thus, the irregularity or randomness of a diffraction pattern of reflection light reflected from the light extraction pattern 140 may increase. For example, a phase and/or a light path of the first reflection light Lre1 which is reflected from the light extraction pattern 140 and passes through the first buffer layer 112*a* of the first pattern region PR1 may differ from a phase and/or a light path of the second reflection light Lre2 which is reflected from the light extraction pattern 140 and passes through the second pattern region PR2 without passing through the first buffer layer 112*a* of the first pattern region PR1, and thus, the reflection lights Lre1 and Lre2 reflected from the light extraction pattern 140 may be optically divided (or separated) by the first pattern region PR1 and the second pattern region PR2, thereby increasing the irregularity or randomness of a diffraction pattern of the reflection light reflected from the light extraction pattern 140.

The organic light emitting display apparatus or the display panel 10 according to an embodiment of the present disclosure may further include an encapsulation portion 200.

The encapsulation portion 200 may be formed on (or over) the substrate 100 to surround the light emitting device layer 160. The encapsulation portion 200 may be formed on (or over) the second electrode E2. For example, the encapsulation portion 200 may surround the display area AA. The encapsulation portion 200 may protect the thin film transistor and the emission layer EL or the like from external impact and prevent oxygen or/and water (or moisture) and particles from being permeated into the emission layer EL.

The encapsulation portion 200 according to an embodiment of the present disclosure may include a plurality of inorganic encapsulation layer. Furthermore, the encapsulation portion 200 may further include at least one organic encapsulation layer interposed between the plurality of inorganic encapsulation layer. The encapsulation portion 200 according to another embodiment of the present disclosure may be changed to a filler surrounding (or completely surrounding) an entire display area AA. In this case, the counter substrate 300 may be bonded to the substrate 100 by using the filler. The filler may include a getter material that absorbs oxygen or/and water (or moisture) or the like.

The organic light emitting display apparatus or the display panel 10 according to an embodiment of the present disclosure may further include a counter substrate 300.

The counter substrate 300 may be coupled to the encapsulation portion 200. The counter substrate 300 may be made of a plastic material, a glass material, or a metal material. For example, when the encapsulation portion 200 includes the plurality of inorganic encapsulation layers, the counter substrate 300 may be omitted.

Alternatively, when the encapsulation portion 200 is changed to the filler, the counter substrate 300 may be combined with the filler, in this case, the counter substrate 300 may be made of a plastic material, a glass material, or a metal material.

The organic light emitting display apparatus or display panel 10 according to an embodiment of the present disclosure may further include a polarizing member 400.

The polarizing member 400 may be configured to block the external light reflected by the light extracting pattern 140 and the pixel circuit, or the like. For example, the polarizing member 400 may be a circular polarizing member or a circular polarizing film. The polarizing member 400 may be disposed at or coupled to the light extraction surface 100*a* of the substrate 100 by using a coupling member (or a transparent adhesive member) 450. For example, the polarizing member 400 may be omitted.

As described above, the organic light emitting display apparatus or display panel 10 according to an embodiment of the present disclosure includes the light extracting pattern 140 disposed or configured at the emission area EA of the subpixel SP, thereby improving light extraction efficiency by changing a path of light generated from the emission layer EL by the light extracting pattern 140. Thus, it is possible to realize high efficiency and high luminance so that the lifespan of the emission layer may be extended, and low power consumption may be realized.

Moreover, the organic light emitting display apparatus or the display panel 10 according to an embodiment of the present disclosure may include the first pattern region PR1 and the second pattern region PR2, which are disposed or configured at the emission area EA of the subpixel SP, and thus, the occurrence of rainbow Mura where reflection light is spread in a radial shape and/or circular ring Mura where reflection light is spread in a radial shape may be prevented or minimized based on the diffraction characteristic of reflection light reflected from the light extraction pattern 140 of the display area AA. For example, a black visibility characteristic or a black color (or black rising) phenomenon caused by the reflection of external light may be reduced in a non-driving or off state of the organic light emitting display apparatus or the display panel 10, thereby implementing real black.

Figure 4:
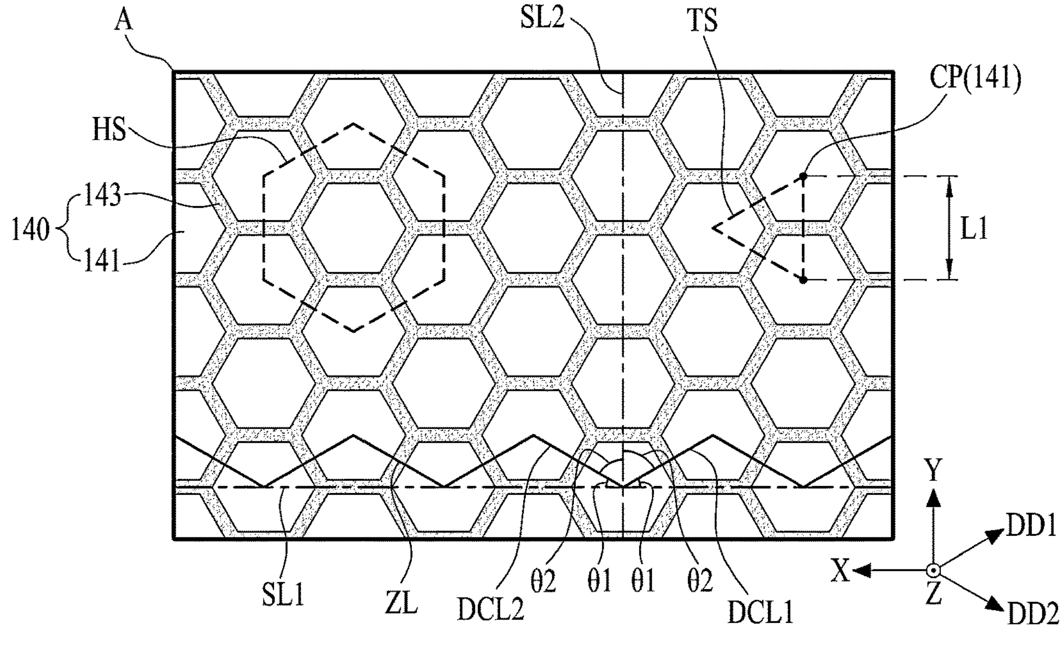
FIG. 4 is an enlarged view of a region 'A' illustrated in FIG. 2.

FIG. 4 is an enlarged view of a region 'A' illustrated in FIG. 2. FIG. 4 is a plan view illustrating a portion of the light extraction pattern illustrated in FIG. 2.

Referring to FIGS. 2 and 4, in the light extraction pattern 140 according to an embodiment of the present disclosure, each of the plurality of concave portions 141 may be disposed in parallel to have a predetermined interval along a second direction Y and may be disposed to be staggered with one another along a first direction X. Thus, the light extraction pattern 140 may include a larger number of concave portions 141 per unit area, thereby increasing the external extraction efficiency of the light emitted from the light emitting device layer 160.

According to an embodiment of the present disclosure, a center portion CP of each of the plurality of concave portions 141 disposed along the first direction X may be positioned or aligned at a first straight line SL1 parallel to the first direction X. In addition, each center portion CP of a plurality of concave portions 141 disposed along the second direction Y may be positioned or aligned at a second straight line SL2 parallel to the second direction Y. For example, the first straight line SL1 may be a horizontal line or a first horizontal line, and the second straight line SL2 may be a vertical line or a second horizontal line.

According to another embodiment of the present disclosure, the plurality of concave portions 141 are disposed in the form of a lattice (or a grid) such that each of a plurality of concave portions 141 disposed at even-numbered horizontal lines parallel to the first direction X may be disposed between a plurality of concave portions 141 disposed at adjacent odd-numbered horizontal lines along the second direction Y. Accordingly, the plurality of concave portions 141 disposed along the second direction Y may be positioned or aligned at a zigzag line ZL having a zigzag shape along the first direction X (or the second direction Y).

According to an embodiment, the center portion CP of each of the adjacent three concave portions 141 may be aligned to form a triangular shape TS. In addition, the center portion CP of each of the six concave portions 141 disposed around one concave portion 141 or surrounding one concave portion 141 may have a 6-angular shape HS in two-dimensions (or in a plan view). For example, each of the plurality of concave portions 141 may be disposed or arranged in a honeycomb structure, a hexagonal structure, or a circular structure in two-dimensions (or in a plan view).

According to an embodiment of the present disclosure, when the plurality of concave portions 141 are arranged (or disposed) in a honeycomb structure, diagonal center lines DCL1 and DCL2 passing through center portions CP of concave portions arranged (or disposed) along diagonal directions DD1 and DD2 between the first direction X and the second direction Y may be respectively inclined from the first straight line SL1 and a second straight line SL2. For example, a first angle θ1 between the diagonal center lines DCL1 and DCL2 and the first straight line SL1 may be about 30 degrees, and a second angle θ2 between the diagonal center lines DCL1 and DCL2 and the second straight line SL2 may be about 60 degrees.

According to an embodiment of the present disclosure, a pitch (or a distance) L1 between the plurality of concave portions 141 may be the same or different from each other. The pitch L1 between the plurality of concave portions 141 may be a distance (or an interval) between the center portions CP of the two adjacent concave portions 141.

The convex portion 143 may be configured to individually surround each of the plurality of concave portions 141. Accordingly, the light extraction pattern 140 may include a plurality of concave portions 141 surrounded by the convex portions 143. The convex portion 143 surrounding one concave portion 141 may have a hexagonal shape (or a honeycomb shape) in two-dimensions (or in a plan view), but embodiments according to the present disclosure are not limited thereto.

Figure 5:
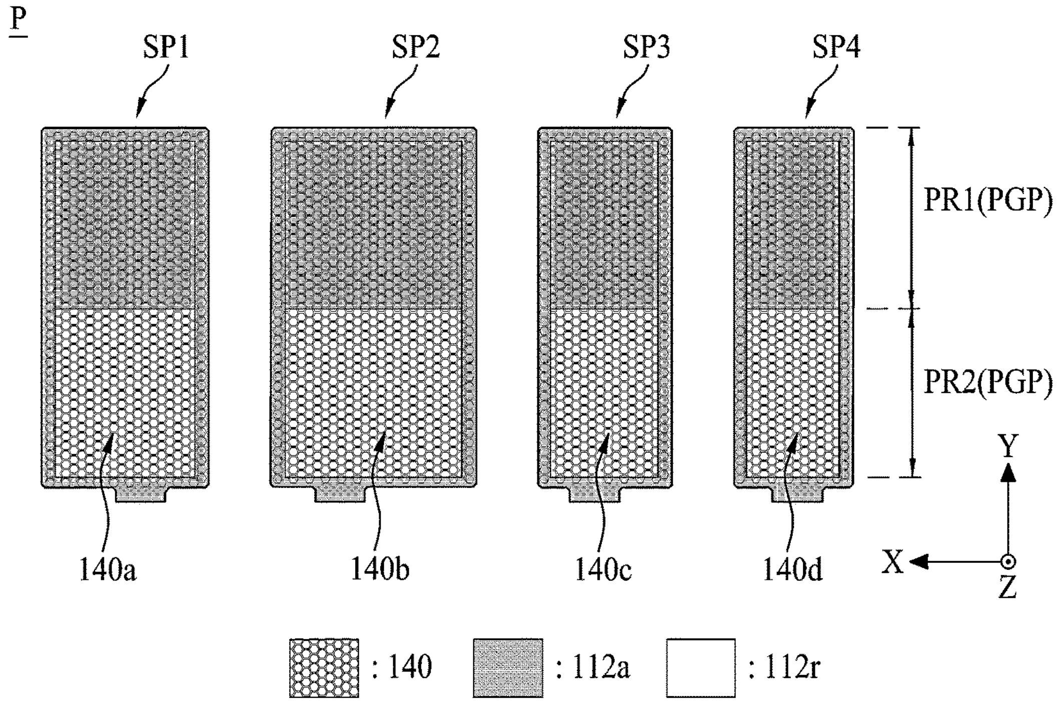
FIG. 5 is a diagram illustrating a phase grating portion according to an embodiment of the present disclosure.
Figure 6:
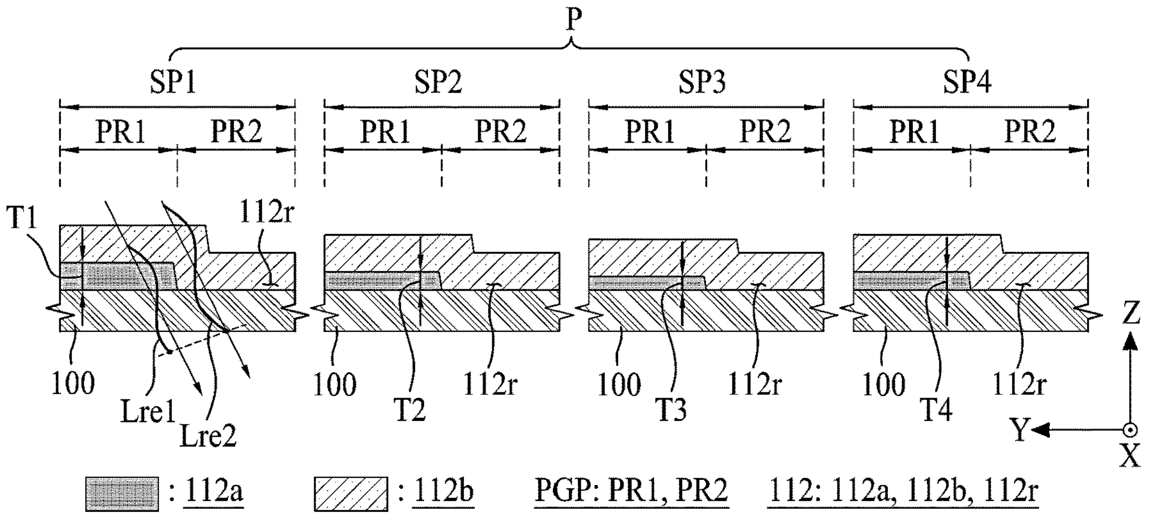
FIG. 6 is a cross-sectional view illustrating the phase grating portion of each of the plurality of subpixels illustrated in FIG. 5.

FIG. 5 is a diagram illustrating a phase grating portion according to an embodiment of the present disclosure. FIG. 6 is a cross-sectional view illustrating the phase grating portion of each of the plurality of subpixels illustrated in FIG. 5.

Referring to FIGS. 5 and 6, a phase grating portion PGP according to an embodiment (or a first embodiment) of the present disclosure may include a first pattern region PR1 and a second pattern region PR2, which are disposed at first to fourth subpixels (or a plurality of subpixels) SP1, SP2, SP3, and SP4 of each of a plurality of pixels P.

With respect to a second direction Y, the first pattern region PR1 may be an upper region (or a top region) of each of the first to fourth subpixels SP1, SP2, SP3, and SP4, and the second pattern region PR2 may be a lower region (or a bottom region) of each of the first to fourth subpixels SP1, SP2, SP3, and SP4. For example, the emission area EA of each of the first to fourth subpixels SP1, SP2, SP3, and SP4 may have an upward-downward two-division structure (or a vertical two-division structure) by the first pattern region PR1 and the second pattern region PR2. For example, the first pattern region PR1 and the second pattern region PR2 may have a same size (or area), but embodiments of the present disclosure are not limited thereto. For example, the first pattern region PR1 and the second pattern region PR2 may have different refractive indexes, but embodiments of the present disclosure are not limited thereto. For example, the first pattern region PR1 and the second pattern region PR2 may have a refractive index difference of 0.1 or more therebetween, but embodiments of the present disclosure are not limited thereto.

According to an embodiment of the present disclosure, the phase grating portion PGP or the first pattern region PR1 and the second pattern region PR2 may be configured at a first buffer layer 112*a* of a buffer layer 112.

The first pattern region PR1 may include the first buffer layer 112*a* and a second buffer layer 112*b* of the buffer layer 112.

According to an embodiment of the present disclosure, the first pattern region PR1 disposed at each of the first to fourth subpixels SP1, SP2, SP3, and SP4 may have a same thickness T1. For example, the first pattern region PR1 disposed at each of the first to fourth subpixels SP1, SP2, SP3, and SP4 may be configured as the first buffer layer 112*a* having a first thickness T1. For example, the first pattern region PR1 disposed at each of the first to fourth subpixels SP1, SP2, SP3, and SP4 may be configured as the first buffer layer 112*a* having a thickness T1 of 100 nm to 150 nm, but embodiments of the present disclosure are not limited thereto.

According to another embodiment of the present disclosure, the first pattern region PR1 disposed at each of the first to fourth subpixels SP1, SP2, SP3, and SP4 may have different thicknesses T1, T2, T3, and T4, but embodiments of the present disclosure are not limited thereto. For example, the first pattern region PR1 disposed at each of the first to fourth subpixels SP1, SP2, SP3, and SP4 may be configured as the first buffer layer 112*a* having different thicknesses T1, T2, T3, and T4. For example, the first pattern region PR1 disposed at each of the first to fourth subpixels SP1, SP2, SP3, and SP4 may be configured as the first buffer layers 112*a* having the different thicknesses T1, T2, T3, and T4, based on a main wavelength of light emitted from each of corresponding first to fourth subpixels SP1, SP2, SP3, and SP4.

The first pattern region PR1 disposed at the first subpixel SP1 may be configured as the first buffer layer 112*a* having a first thickness T1. The first pattern region PR1 disposed at the second subpixel SP2 may be configured as the first buffer layer 112*a* having a second thickness T2. The first pattern region PR1 disposed at the third subpixel SP3 may be configured as the first buffer layer 112*a* having a third thickness T3. The first pattern region PR1 disposed at the fourth subpixel SP4 may be configured as the first buffer layer 112*a* having a fourth thickness T4. For example, the first thickness T1 may be thicker than each of second to fourth thicknesses T2, T3, and T4, and the third thickness T3 may be thinner than the second and fourth thicknesses T2 and T4. The second thickness T2 and the fourth thickness T4 may have a same thickness or different thicknesses within a range which is thinner than the first thickness T1 and thicker than the third thickness T3.

The second pattern region PR2 may include a removal region 112*r* the buffer layer 112 from which the first buffer layer 112*a* has been removed. The second pattern region PR2 may include only the second buffer layer 112*b* of the buffer layer 112.

According to an embodiment of the present disclosure, the first pattern region PR1 disposed at each of the first to fourth subpixels SP1, SP2, SP3, and SP4 may be configured as the first buffer layer 112*a* having a thickness T1, T2, T3, and T4 corresponding to a path difference ΔX, except an integer multiple of a wavelength λ, of a path difference ΔX between the first reflection light Lre1 passing through the first pattern region PR1 and the second reflection light Lre2 passing through the second pattern region PR2, based on the following Equation 1.

$$0.1\times\lambda<\Delta X<9.9\times\lambda \quad \text{[Equation 1]}$$

In Equation 1, λ (lambda) may denote a wavelength and may be 450 nm to 700 nm (nanometer). In Equation 1, as ΔX gets close to 0.5 (λ/2), destructive interference between the first reflection light Lre1 passing through the first pattern region PR1 and the second reflection light Lre2 passing through the second pattern region PR2 may increase.

According to an embodiment of the present disclosure, a path difference ΔX between the first reflection light Lre1 passing through the first pattern region PR1 configured as the second buffer layer 112*b* having a refractive index of 1.5 and the first buffer layer 112*a* having a refractive index of 1.8 and a thickness of 100 nm and the second reflection light Lre2 passing through the second pattern region PR2 configured as only the second buffer layer 112*b* having a the refractive index of 1.5 without passing through the first buffer layer 112*a* may be 70 nm to 100 nm, but embodiments according to present disclosure are not limited thereto.

As described above, the phase grating portion PGP according to an embodiment of the present disclosure may include the first pattern region PR1 and the second pattern region PR2, which have different refractive indexes or provide different light paths of the reflection lights Lre1 and Lre2, and thus, may optically divide (or separate) the reflection lights Lre1 and Lre2 reflected from the light extraction pattern 140 to increase the irregularity or randomness of a diffraction pattern of each of the reflection lights Lre1 and Lre2, and thus, the occurrence of rainbow Mura where reflection light is spread in a radial shape and/or circular ring Mura where reflection light is spread in a radial shape may be prevented or minimized based on a diffraction characteristic of reflection light reflected from the light extraction pattern 140.

Figure 7:
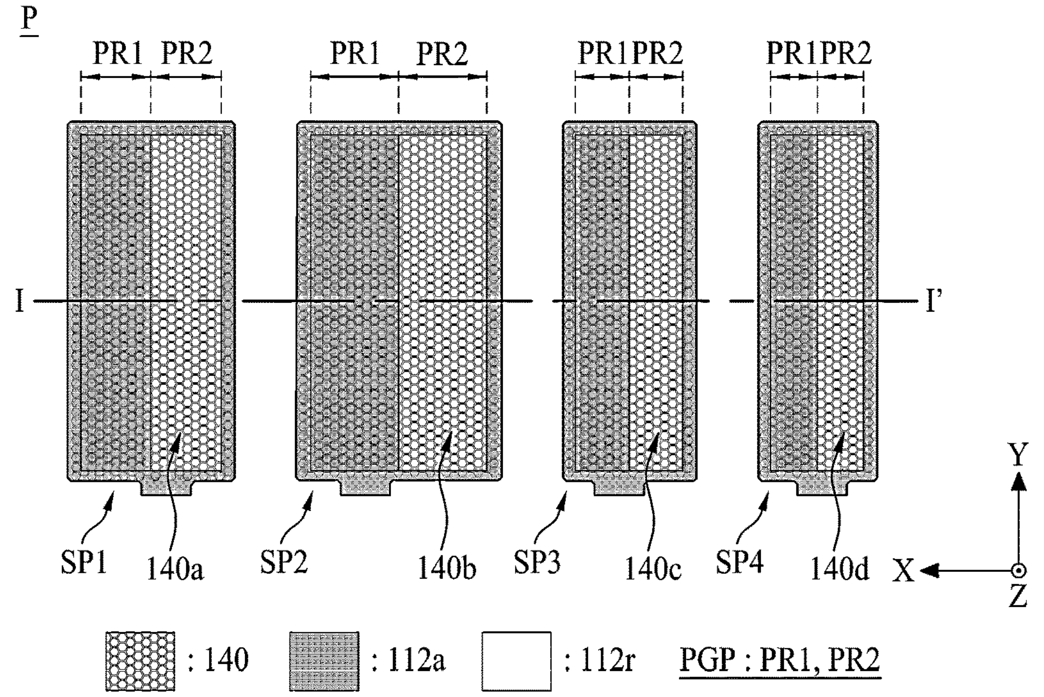
FIG. 7 is a diagram illustrating a phase grating portion according to another embodiment of the present disclosure.
Figure 8:
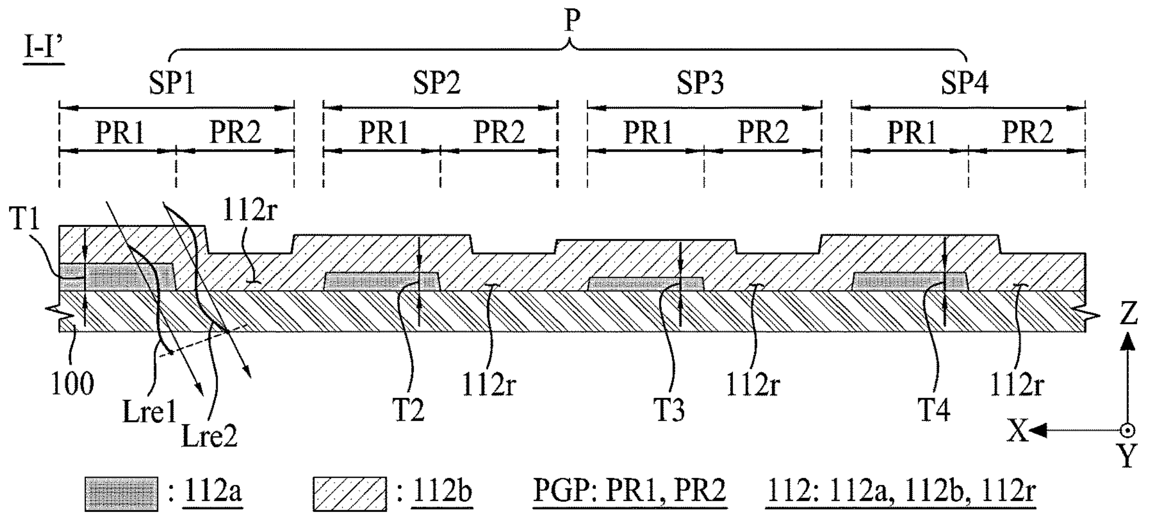
FIG. 8 is a cross-sectional view taken along line I-I' illustrated in FIG. 7.

FIG. 7 is a diagram illustrating a phase grating portion according to another embodiment of the present disclosure. FIG. 8 is a cross-sectional view taken along line I-I' illustrated in FIG. 7. FIG. 8 is a cross-sectional view illustrating the phase grating portion of each of the plurality of subpixels illustrated in FIG. 7. FIGS. 7 and 8 illustrate an embodiment implemented by modifying the phase grating portion described above with reference to FIGS. 1 to 6.

Referring to FIGS. 7 and 8, a phase grating portion PGP according to another embodiment (or a second embodiment) of the present disclosure may include a first pattern region PR1 and a second pattern region PR2, which are disposed at first to fourth subpixels (or a plurality of subpixels) SP1, SP2, SP3, and SP4 of each of a plurality of pixels P.

With respect to a first direction X, the first pattern region PR1 may be a left region of each of the first to fourth subpixels SP1, SP2, SP3, and SP4, and the second pattern region PR2 may be a right region of each of the first to fourth subpixels SP1, SP2, SP3, and SP4. For example, the emission area EA of each of the first to fourth subpixels SP1, SP2, SP3, and SP4 may have a left-right two-division structure (or a horizontal two-division tetragonal structure) by the first pattern region PR1 and the second pattern region PR2. For example, the first pattern region PR1 and the second pattern region PR2 may have a same size (or area), but embodiments of the present disclosure are not limited thereto. For example, the first pattern region PR1 and the second pattern region PR2 may have different refractive indexes, but embodiments of the present disclosure are not limited thereto. For example, the first pattern region PR1 and the second pattern region PR2 may have a refractive index difference of 0.1 or more therebetween, but embodiments of the present disclosure are not limited thereto.

According to an embodiment of the present disclosure, the phase grating portion PGP or the first pattern region PR1 and the second pattern region PR2 may be configured at a first buffer layer 112*a* of a buffer layer 112.

The first pattern region PR1 may include the first buffer layer 112*a* and a second buffer layer 112*b* of the buffer layer 112. The second pattern region PR2 may include a removal region 112*r* of the buffer layer 112 from which the first buffer layer 112*a* has been removed. The second pattern region PR2 may include only the second buffer layer 112*b* of the buffer layer 112. The first pattern region PR1 and the second pattern region PR2 may be a same or substantially a same as the first pattern region PR1 and the second pattern region PR2 described above with reference to FIGS. 5 and 6 except for being respectively disposed or provided in a left region and a right region of each of first to fourth subpixels SP1, SP2, SP3, and SP4, and thus, repeated descriptions thereof are omitted. The descriptions of the phase grating portion PGP or the first pattern region PR1 and the second pattern region PR2 illustrated in FIGS. 5 and 6 may be included in the descriptions of the phase grating portion PGP or the first pattern region PR1 and the second pattern region PR2 illustrated in FIGS. 7 and 8.

As described above, the phase grating portion PGP according to another embodiment of the present disclosure may have or provide a same effect as that of the phase grating portion PGP described above with reference to FIGS. 5 and 6.

Figure 9:
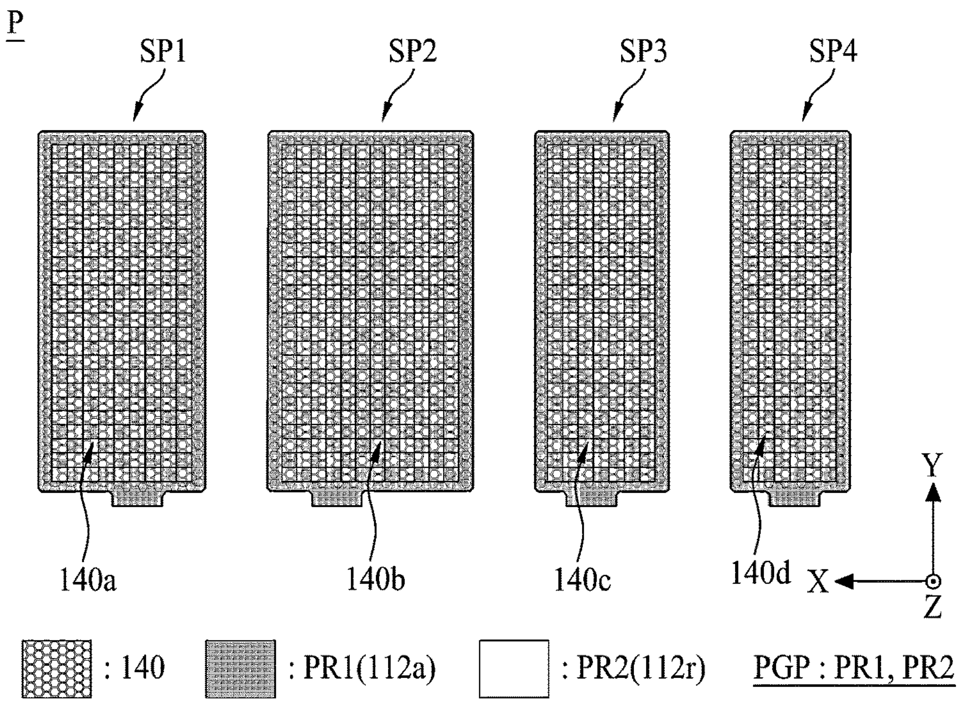
FIG. 9 is a diagram illustrating a phase grating portion according to another embodiment of the present disclosure.

FIG. 9 is a diagram illustrating a phase grating portion according to another embodiment of the present disclosure. FIG. 9 illustrates an embodiment implemented by modifying the phase grating portion described above with reference to FIGS. 1 to 6.

Referring to FIG. 9, a phase grating portion PGP according to another embodiment (or a third embodiment) of the present disclosure may include a plurality of first pattern regions PR1 and a plurality of second pattern regions PR2, which are disposed at first to fourth subpixels (or a plurality of subpixels) SP1, SP2, SP3, and SP4 of each of a plurality of pixels P.

The plurality of first pattern regions PR1 and the plurality of second pattern regions PR2 may be alternately disposed or configured along a first direction X and a second direction Y. For example, the plurality of first pattern regions PR1 and the plurality of second pattern regions PR2 may be alternately disposed or configured along an emission area of each of first to fourth subpixels SP1, SP2, SP3, and SP4 along the first direction X and the second direction Y.

The plurality of first pattern regions PR1 may be disposed or configured along the emission area of each of the first to fourth subpixels SP1, SP2, SP3, and SP4 to have a certain interval along the first direction X and the second direction Y. For example, the plurality of first pattern regions PR1 may be disposed or configured in a grating pattern shape or a checkered pattern shape at the emission area of each of the first to fourth subpixels SP1, SP2, SP3, and SP4.

The plurality of second pattern regions PR2 may be disposed or configured between the plurality of first pattern regions PR1 to have a certain interval along the first direction X and the second direction Y.

Each of the plurality of first pattern regions PR1 and the plurality of second pattern regions PR2 may be configured to have a tetragonal shape. For example, each of the plurality of first pattern regions PR1 and the plurality of second pattern regions PR2 may have a tetragonal pattern. For example, the plurality of first pattern regions PR1 may have a same size (or area), or may have different sizes (or areas). For example, the plurality of second pattern regions PR2 may have a same size (or area), or may have different sizes (or areas). For example, the plurality of first pattern regions PR1 may have a same refractive index. For example, the plurality of second pattern regions PR2 may have a same refractive index. For example, the plurality of first pattern regions PR1 and the plurality of second pattern regions PR2 may have different refractive indexes, but embodiments according to present disclosure are not limited thereto. For example, the plurality of first pattern regions PR1 and the plurality of second pattern regions PR2 may have a refractive index difference of 0.1 or more, but embodiments according to present disclosure are not limited thereto.

Each of the plurality of first pattern regions PR1 and the plurality of second pattern regions PR2 may overlap or overlay a convex portion or a concave portion of a light extraction pattern 140 disposed at each of the first to fourth subpixels SP1, SP2, SP3, and SP4. Accordingly, reflection light reflected from the convex portion or the concave portion of the light extraction pattern 140 may have a different phase or light path based on the plurality of first pattern regions PR1 and the plurality of second pattern regions PR2.

Therefore, each of the plurality of first pattern regions PR1 and the plurality of second pattern regions PR2 may optically divide (or separate) reflection lights reflected from the light extraction patterns 140 to more increase the irregularity or randomness of a diffraction pattern of each of the reflection lights, and thus, the occurrence of rainbow Mura where reflection light is spread in a radial shape and/or circular ring Mura where reflection light is spread in a radial shape may be better prevented or more minimized based on a diffraction characteristic of each of the reflection lights reflected from the light extraction patterns 140.

According to an embodiment of the present disclosure, the phase grating portion PGP or the plurality of first pattern regions PR1 and the plurality of second pattern regions PR2 may be configured at a first buffer layer 112*a* of a buffer layer 112.

Each of the plurality of first pattern regions PR1 may include all of the first buffer layer 112*a* and a second buffer layer 112*b* of the buffer layer 112. Each of the plurality of second pattern regions PR2 may include a removal region 112*r* of the buffer layer 112 from which the first buffer layer 112*a* has been removed. Each of the plurality of second pattern regions PR2 may include only the second buffer layer 112*b* of the buffer layer 112. The plurality of first pattern regions PR1 and the plurality of second pattern regions PR2 may be a same or substantially a same as the first pattern region PR1 and the second pattern region PR2 described above with reference to FIGS. 5 and 6 except for being respectively disposed or configured in a grating pattern shape at each of the first to fourth subpixels SP1, SP2, SP3, and SP4, and thus, repeated descriptions thereof are omitted. The descriptions of the phase grating portion PGP or the first pattern region PR1 and the second pattern region PR2 illustrated in FIGS. 5 and 6 may be included in the descriptions of the phase grating portion PGP or the plurality of first pattern regions PR1 and the plurality of second pattern regions PR2 illustrated in FIG. 9.

As described above, the phase grating portion PGP according to another embodiment of the present disclosure may have or provide a same effect as that of the phase grating portion PGP described above with reference to FIGS. 5 and 6.

Figure 10:
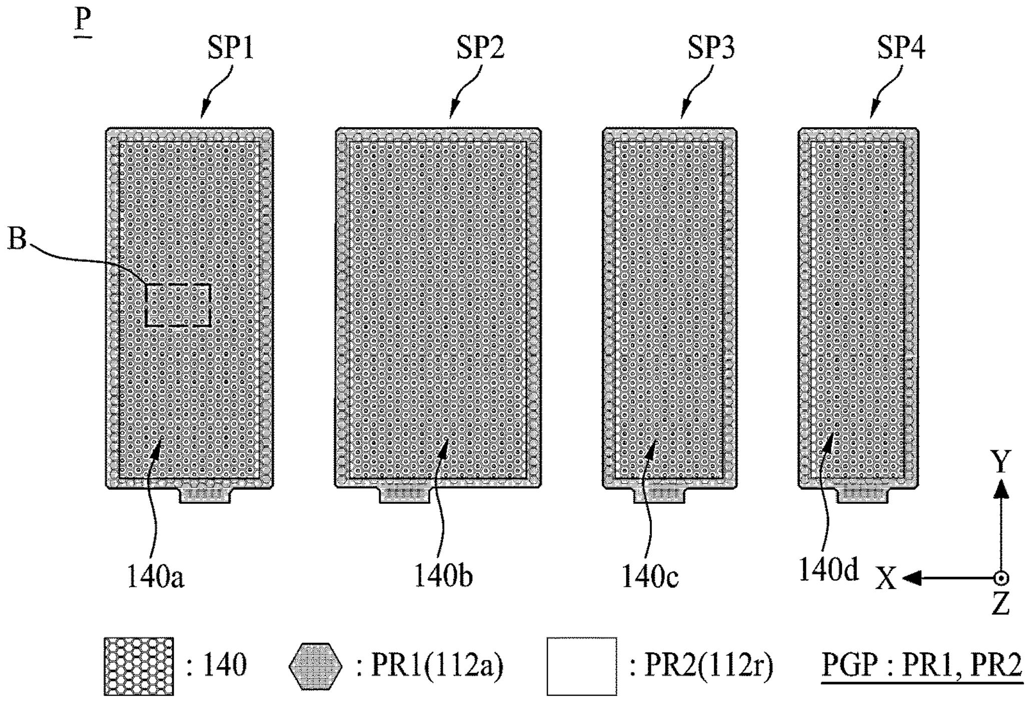
FIG. 10 is a diagram illustrating a phase grating portion according to another embodiment of the present disclosure.
Figure 11:
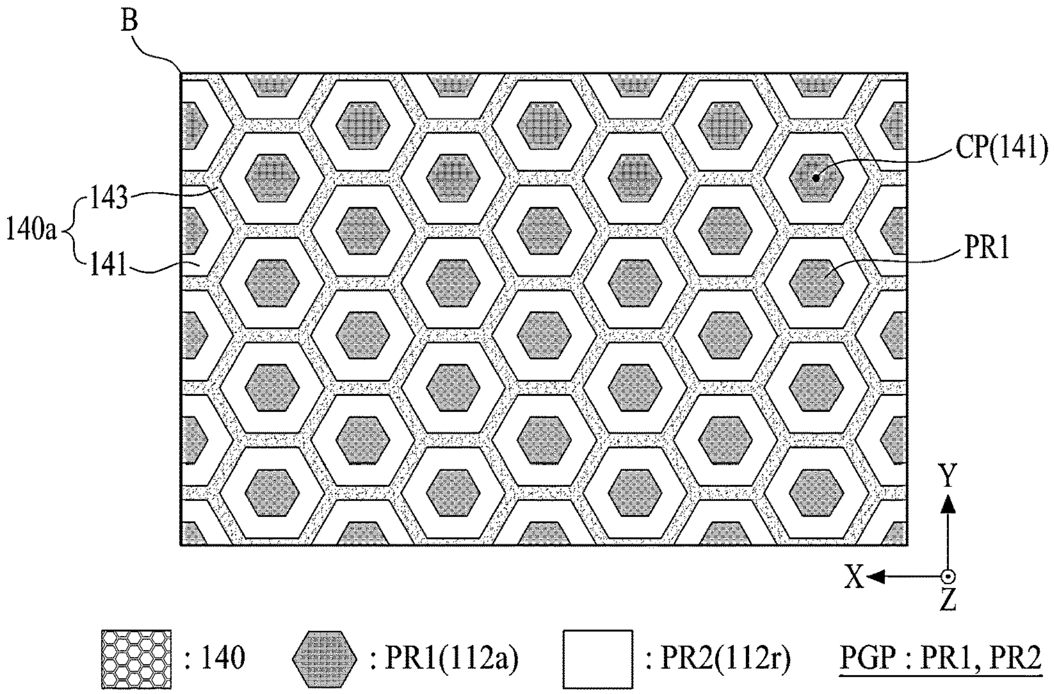
FIG. 11 is an enlarged view of a region 'B' illustrated in FIG. 10.

FIG. 10 is a diagram illustrating a phase grating portion according to another embodiment of the present disclosure. FIG. 11 is an enlarged view of a region 'B' illustrated in FIG. 10. FIGS. 10 and 11 illustrate an embodiment implemented by modifying the phase grating portion described above with reference to FIGS. 1 to 6.

Referring to FIGS. 10 and 11, a phase grating portion PGP according to another embodiment (or a fourth embodiment) of the present disclosure may include a plurality of first pattern regions PR1 and a second pattern region PR2, which are disposed at first to fourth subpixels (or a plurality of subpixels) SP1, SP2, SP3, and SP4 of each of a plurality of pixels P.

The plurality of first pattern regions PR1 may be disposed to have a certain interval along a second direction Y and may be disposed to be staggered along a first direction X. For example, the plurality of first pattern regions PR1 may be disposed to have a certain interval along a diagonal direction between the first direction X and the second direction Y. For example, each of the plurality of first pattern regions PR1 disposed at even-numbered horizontal lines parallel to the first direction X may be disposed between the plurality of first pattern regions PR1 disposed at adjacent odd-numbered horizontal lines along the second direction Y. Accordingly, the plurality of first pattern regions PR1 disposed in a zigzag shape along the first direction X.

Each of the plurality of first pattern regions PR1 may have a same shape as that of each of a plurality of concave portions 141 in light extraction patterns 140 disposed in first to fourth subpixels SP1, SP2, SP3, and SP4 of each of a plurality of pixels P, but embodiments of the present disclosure are not limited thereto. For example, each of the plurality of first pattern regions PR1 may have a same hexagonal shape as that of the concave portion 141, but is not limited thereto and may have a circular shape, an oval shape, or a three or more-angled polygonal shape.

Each of the plurality of first pattern regions PR1 may have a size which is a same as or different from that of each of the plurality of concave portions 141. For example, each of the plurality of first pattern regions PR1 may have a hexagonal shape which is smaller than the concave portion 141, but is not limited thereto and may have a circular shape, an oval shape, or a three or more-angled polygonal shape, which is smaller than the concave portion 141.

Each of the plurality of first pattern regions PR1 may overlap at least a portion of a corresponding concave portion 141 of the plurality of concave portions 141. A center portion CP of each of the plurality of first pattern regions PR1 may be disposed or aligned at a center portion CP of a corresponding concave portion 141 of the plurality of concave portions 141. Accordingly, each of the plurality of first pattern regions PR1 may correspond to, in a one-to-one relationship, each of the plurality of concave portions 141 of the light extraction pattern 140 disposed in the emission area of each of the first to fourth subpixels SP1, SP2, SP3, and SP4. For example, the plurality of first pattern regions PR1 may be disposed or arranged in a honeycomb structure, a hexagonal structure, or a circular structure) in two-dimensions (or in a plan view).

A plurality of second pattern regions PR2 may be disposed between a plurality of second pattern regions, respectively, and include a region between the plurality of first pattern regions PR1. For example, the second pattern region PR2 may include the other region, except the plurality of first pattern regions PR1, of the emission area of the first to fourth subpixels SP1, SP2, SP3, and SP4. Accordingly, the plurality of first pattern regions PR1 may be surrounded by the second pattern region PR2. For example, the second pattern region PR2 may overlap or overlay a convex portion 143 of the light extraction pattern 140. The second pattern region PR2 may overlap or overlay the convex portion 143 and the other portion, except a center portion, of each of the plurality of concave portions 141 of the light extraction pattern 140.

The plurality of first pattern regions PR1 may have a same refractive index. For example, the plurality of first pattern regions PR1 and the plurality of second pattern regions PR2 may have different refractive indexes, but embodiments according to present disclosure are not limited thereto. For example, the plurality of first pattern regions PR1 and the plurality of second pattern regions PR2 may have a refractive index difference of 0.1 or more, but embodiments according to present disclosure are not limited thereto.

According to an embodiment of the present disclosure, reflection light reflected from the concave portion 141 of the light extraction pattern 140 may pass through each of the plurality of first pattern regions PR1. Reflection light reflected from the convex portion 143 of the light extraction pattern 140 may pass through the second pattern region PR2. Accordingly, reflection light reflected from the convex portion 143 or the concave portion 141 of the light extraction pattern 140 may have a different phase or light path, based on the plurality of first pattern regions PR1 and the second pattern region PR2.

Therefore, each of the plurality of first pattern regions PR1 and the second pattern region PR2 may optically and multiply divide (or separate) reflection lights reflected from the light extraction patterns 140 to more increase the irregularity or randomness of a diffraction pattern of each of the reflection lights, and thus, the occurrence of rainbow Mura where reflection light is spread in a radial shape and/or circular ring Mura where reflection light is spread in a radial shape may be better prevented or more minimized based on a diffraction characteristic of each of the reflection lights reflected from the light extraction patterns 140.

According to an embodiment of the present disclosure, the phase grating portion PGP or the plurality of first pattern regions PR1 and the plurality of second pattern regions PR2 may be configured at a first buffer layer 112*a* of a buffer layer 112.

The plurality of first pattern regions PR1 may include the first buffer layer 112*a* and a second buffer layer 112*b* of the buffer layer 112. The plurality of second pattern regions PR2 may include a removal region 112*r* of the first buffer layer 112*a* of the buffer layer 112. The plurality of second pattern regions PR2 may include only the second buffer layer 112*b* of the buffer layer 112. The plurality of first pattern regions PR1 and the plurality of second pattern regions PR2 may be a same or substantially a same as the first pattern region PR1 and the second pattern region PR2 described above with reference to FIGS. 5 and 6 except for being respectively disposed or configured in a honeycomb structure at each of the first to fourth subpixels SP1, SP2, SP3, and SP4, and thus, repeated descriptions thereof are omitted. The descriptions of the phase grating portion PGP or the first pattern region PR1 and the second pattern region PR2 illustrated in FIGS. 5 and 6 may be included in the descriptions of the phase grating portion PGP or the plurality of first pattern regions PR1 and the plurality of second pattern regions PR2 illustrated in FIGS. 10 and 11.

In FIGS. 10 and 11, the phase grating portion PGP according to another embodiment of the present disclosure has been described as including the plurality of first pattern regions PR1 and the second pattern region PR2, but embodiments of the present disclosure are not limited thereto. For example, the phase grating portion PGP according to another embodiment of the present disclosure may include a first pattern region PR1 and a plurality of second pattern regions PR2. For example, the plurality of first pattern regions PR1 described above with reference to FIGS. 10 and 11 may be changed to a plurality of second pattern regions PR2, and the second pattern region PR2 may be changed to a first pattern region PR1.

As described above, the phase grating portion PGP according to another embodiment of the present disclosure may have or provide a same effect as that of the phase grating portion PGP described above with reference to FIGS. 5 and 6.

Figure 12:
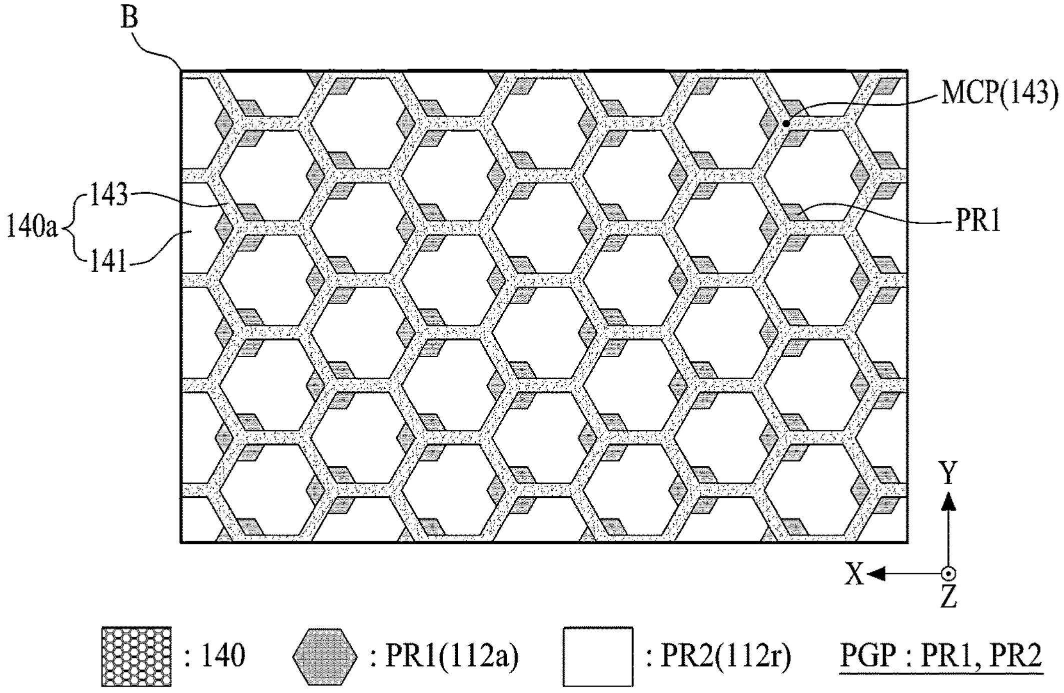
FIG. 12 is another enlarged view of a region 'B' illustrated in FIG. 10.

FIG. 12 is another enlarged view of a region 'B' illustrated in FIG. 10. FIG. 12 illustrates an embodiment implemented by changing a position of each of a plurality of first pattern regions in the phase grating portion described above with reference to FIGS. 10 and 11. Therefore, in the following description, except for a position of each of a plurality of first pattern regions, descriptions of the other elements may be the same as the descriptions of FIGS. 10 and 11, and thus, repeated descriptions may be omitted or will be briefly given.

Referring to FIG. 12, in a phase grating portion PGP according to another embodiment of the present disclosure, each of a plurality of first pattern regions PR1 may be disposed or configured to overlap or overlay a convex portion 143 of a light extraction pattern 140.

According to an embodiment of the present disclosure, a center portion of each of the plurality of first pattern regions PR1 may be disposed or configured to overlap or overlay the convex portion 143 of the light extraction pattern 140. The center portion of each of the plurality of first pattern regions PR1 may be disposed or configured to overlap or overlay the convex portion 143 between three adjacent concave portions 141 of the light extraction pattern 140. For example, the center portion of each of the plurality of first pattern regions PR1 may be disposed or configured to overlap or overlay a center portion MCP of the convex portion 143 between three adjacent concave portions 141 of the light extraction pattern 140.

According to an embodiment of the present disclosure, each of the plurality of first pattern regions PR1 may be disposed or configured to overlap or overlay the concave portion 141 having a hexagonal shape or one or more of corner portions of the convex portion 143 having a hexagonal shape surrounding one concave portion 141. For example, the center portion of each of the plurality of first pattern regions PR1 may be disposed or configured to overlap or overlay the concave portion 141 having a hexagonal shape or the center portion MCP of three corner portions spaced apart from one another among first to sixth corner portions of the convex portion 143.

A plurality of second pattern region PR2 may be disposed between a plurality of second pattern regions, respectively, and include a region between the plurality of first pattern regions PR1. For example, the second pattern region PR2 may include the other region, except the plurality of first pattern regions PR1, of an emission area of each of first to fourth subpixels SP1, SP2, SP3, and SP4 of each of a plurality of pixels P. Accordingly, each of the plurality of first pattern regions PR1 may be surrounded by the second pattern region PR2.

The plurality of first pattern regions PR1 described above with reference to FIG. 12 may be changed to a plurality of second pattern regions PR2, and the second pattern region PR2 may be changed to a first pattern region PR1.

As described above, the phase grating portion PGP according to another embodiment of the present disclosure may have or provide a same effect as that of the phase grating portion PGP described above with reference to FIGS. 5 and 6.

Figure 13:
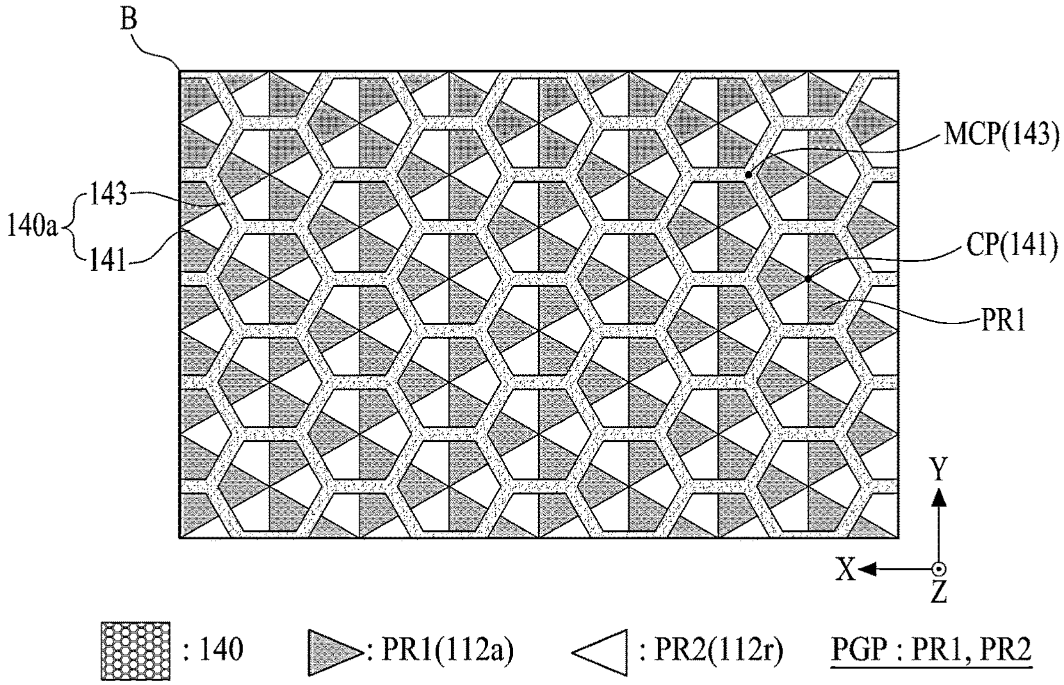
FIG. 13 is an enlarged view of a region 'B' illustrated in FIG. 10.

FIG. 13 is another enlarged view of a region 'B' illustrated in FIG. 10. FIG. 13 illustrates an embodiment implemented by changing a shape and a position of each of a plurality of first pattern regions at the phase grating portion described above with reference to FIGS. 10 and 11. Therefore, in the following description, except for a shape and a position of each of a plurality of first pattern regions, descriptions of the other elements may be the same as the descriptions of FIGS. 10 and 11, and thus, repeated descriptions may be omitted or will be briefly given.

Referring to FIG. 13, a phase grating portion PGP according to another embodiment of the present disclosure may include a plurality of first pattern regions PR1 and a plurality of second pattern regions PR2.

Each of the plurality of first pattern regions PR1 may have a triangular shape.

The plurality of first pattern regions PR1 may be disposed to have a certain interval along a second direction Y and may be disposed to be staggered along a first direction X. For example, the plurality of first pattern regions PR1 may be disposed to have a certain interval along a diagonal direction between the first direction X and the second direction Y. For example, each of the plurality of first pattern regions PR1 disposed at even-numbered horizontal lines parallel to the first direction X may be disposed between the plurality of first pattern regions PR1 disposed at adjacent odd-numbered horizontal lines along the second direction Y. Accordingly, the plurality of first pattern regions PR1 may be disposed in a zigzag shape along the first direction X.

Each of the plurality of first pattern regions PR1 may be disposed or configured to overlap or overlay a portion of a concave portion 141 and a portion of a convex portion 143 of a light extraction pattern 140.

According to an embodiment of the present disclosure, a center portion of each of the plurality of first pattern regions PR1 may be disposed or configured to overlap or overlay the convex portion 143 of the light extraction pattern 140. The center portion of each of the plurality of first pattern regions PR1 may be disposed or configured to overlap or overlay the convex portion 143 between three adjacent concave portions 141 of the light extraction pattern 140. For example, the center portion of each of the plurality of first pattern regions PR1 may be disposed or configured to overlap or overlay a center portion MCP of the convex portion 143 between three adjacent concave portions 141 of the light extraction pattern 140.

According to an embodiment of the present disclosure, each of the plurality of first pattern regions PR1 may be disposed or configured to overlap or overlay the concave portion 141 having a hexagonal shape or one or more of corner portions of the convex portion 143 having a hexagonal shape surrounding one concave portion 141. For example, the center portion of each of the plurality of first pattern regions PR1 may be disposed or configured to overlap or overlay the concave portion 141 having a hexagonal shape or the center portion MCP of three corner portions spaced apart from one another among first to sixth corner portions of the convex portion 143. For example, the center portion of each of the plurality of first pattern regions PR1 may be disposed or configured to overlap or overlay the concave portion 141 having the hexagonal shape or the center portion MCP of first, third, and fifth corner portions of the convex portion 143.

Each of the plurality of second pattern regions PR2 may have a triangular shape. The plurality of second pattern regions PR2 may include a region between the plurality of first pattern regions PR1. For example, the second pattern region PR2 may include the other region, except the plurality of first pattern regions PR1, of an emission area of each of first to fourth subpixels SP1, SP2, SP3, and SP4 of each of a plurality of pixels P. Accordingly, each of the plurality of second pattern regions PR2 may be surrounded by three first pattern regions PR1. For example, the plurality of first pattern regions PR1 and the plurality of second pattern regions PR2 may be alternately disposed or configured along each of the first direction X, the second direction Y, and a diagonal direction.

Each of the plurality of second pattern regions PR2 may be disposed or configured to overlap or overlay a convex portion 143 different from the plurality of first pattern regions PR1 of convex portions 143 of the light extraction pattern 140. For example, a center portion of each of the plurality of second pattern regions PR2 may be disposed or configured to overlap or overlay the convex portion 143 between three adjacent concave portions 141 of the light extraction pattern 140. For example, the center portion of each of the plurality of second pattern regions PR2 may be disposed or configured to overlap or overlay a center portion MCP of the convex portion 143 between three adjacent concave portions 141 of the light extraction pattern 140. For example, the center portion of each of the plurality of second pattern regions PR2 may be disposed or configured to overlap or overlay the concave portion 141 having a hexagonal shape or a center portion MCP of second, fourth, and fifth corner portions of the convex portion 143 having a hexagonal shape.

According to an embodiment of the present disclosure, vertex portions of each of the plurality of first pattern regions PR1 having a triangular shape may be positioned or aligned at a center portions CP of each of the three adjacent concave portions 141. Vertex portions of each of the plurality of second pattern regions PR2 having a triangular shape may be positioned or aligned at a center portions CP of each of the three adjacent concave portions 141. Accordingly, three adjacent first pattern regions PR1 of the plurality of first pattern regions PR1 and three adjacent second pattern regions PR2 of the plurality of second pattern regions PR2 may have a hexagonal shape, and vertex portions at which three adjacent first pattern regions PR1 contact three adjacent second pattern regions PR2 may be positioned or aligned at center portions CP of the concave portions 141. Therefore, reflection light reflected from one concave portion 141 may be optically and multiply divided (or separated) by three first pattern regions PR1 and three second pattern regions PR2.

The plurality of first pattern regions PR1 described above with reference to FIG. 13 may be changed to the plurality of second pattern regions PR2, and the plurality of second pattern regions PR2 may be changed to the plurality of first pattern regions PR1.

As described above, the phase grating portion PGP according to another embodiment of the present disclosure may have or provide a same effect as that of the phase grating portion PGP described above with reference to FIGS. 5 and 6.

Figure 14:
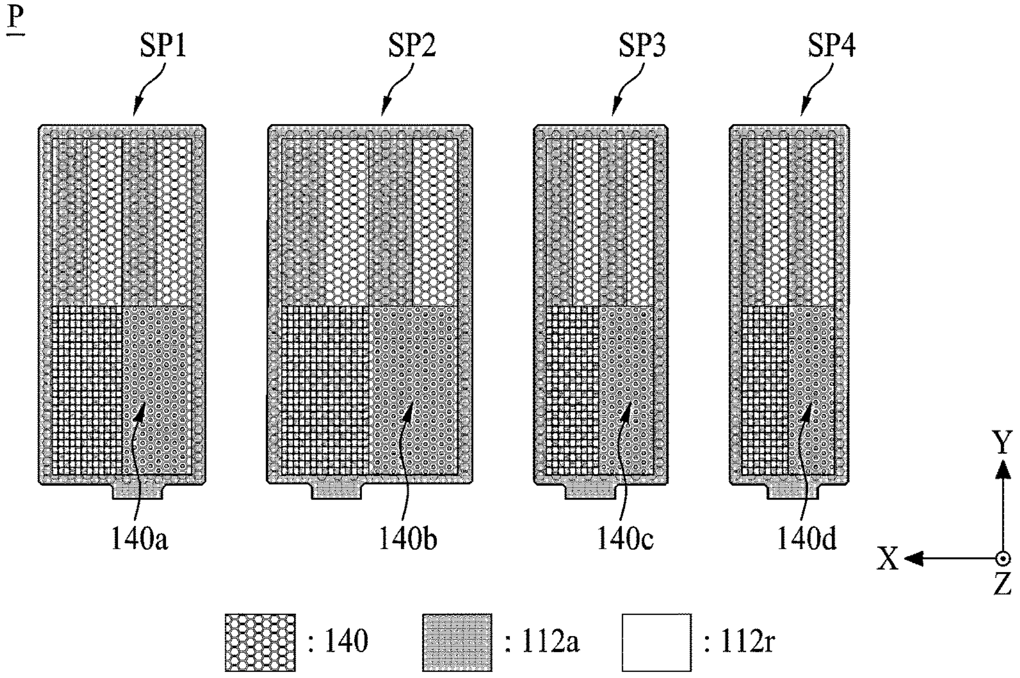
FIG. 14 is a diagram illustrating a phase grating portion according to another embodiment of the present disclosure.
Figure 15:
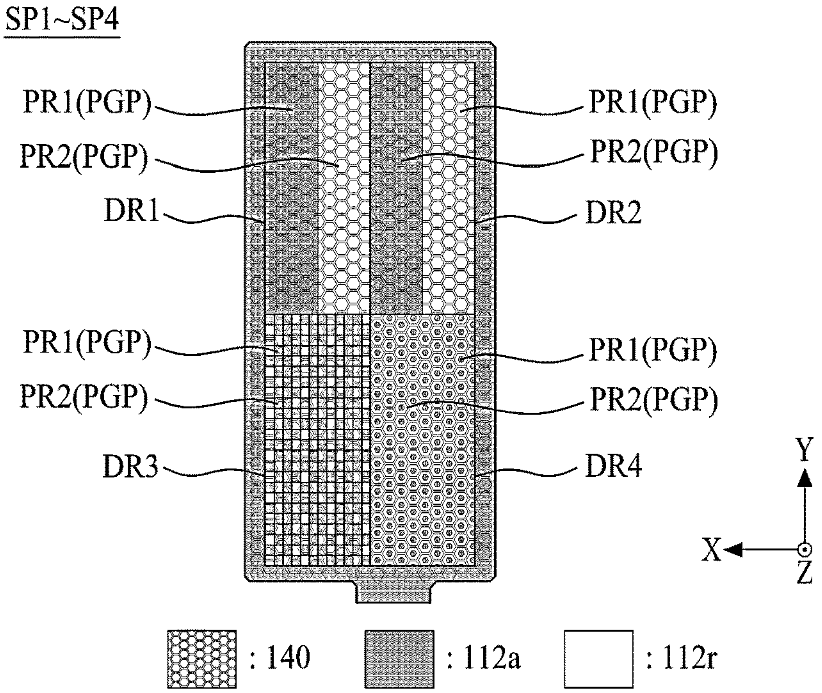
FIG. 15 is a diagram illustrating the enlargement of the subpixel illustrated in FIG. 14.

FIG. 14 is a diagram illustrating a phase grating portion according to another embodiment of the present disclosure. FIG. 15 is a diagram illustrating the enlargement of the subpixel illustrated in FIG. 14. FIGS. 14 and 15 illustrate an embodiment implemented by modifying the phase grating portion described above with reference to FIGS. 1 to 6.

Referring to FIGS. 14 and 15, a phase grating portion PGP according to another embodiment (or a fifth embodiment) of the present disclosure may be disposed or configured at each of a plurality of division regions DR1, DR2, DR3, and DR4 which is disposed at first to fourth subpixels (or a plurality of subpixels) SP1, SP2, SP3, and SP4 of each of a plurality of pixels P. For example, the phase grating portion PGP may include may be disposed or configured at each of first to fourth division regions DR1, DR2, DR3, and DR4 which is disposed at the first to fourth subpixels (or a plurality of subpixels) SP1, SP2, SP3, and SP4 of each of a plurality of pixels P.

Each of the first to fourth subpixels (or the plurality of subpixels) SP1, SP2, SP3, and SP4 of each of the plurality of pixels P according to an embodiment of the present disclosure may include the plurality of division regions DR1, DR2, DR3, and DR4. For example, an emission area of each of the first to fourth subpixels SP1, SP2, SP3, and SP4 may include the plurality of division regions DR1, DR2, DR3, and DR4. For example, the emission area of each of the first to fourth subpixels SP1, SP2, SP3, and SP4 may include two or more division regions DR1, DR2, DR3, and DR4. For example, each of the first to fourth subpixels SP1, SP2, SP3, and SP4 may include the first to fourth division regions DR1, DR2, DR3, and DR4. For example, the emission area of each of the first to fourth subpixels SP1, SP2, SP3, and SP4 may include the first to fourth division regions DR1, DR2, DR3, and DR4.

The first to fourth division regions DR1, DR2, DR3, and DR4 may be separated or spatially separated from each other within the emission area each of the first to fourth subpixels SP1, SP2, SP3, and SP4. The first to fourth division regions DR1, DR2, DR3, and DR4 may be disposed in parallel along a first direction X and a second direction Y within the second subpixel SP2. For example, each the first to fourth division regions DR1, DR2, DR3, and DR4 may be disposed in a lattice pattern shape within the emission area each of the first to fourth subpixels SP1, SP2, SP3, and SP4. For example, the first to fourth division regions DR1, DR2, DR3, and DR4 may have a tetragonal shape, e.g., a rectangular shape. For example, the first to fourth division regions DR1, DR2, DR3, and DR4 may have a rectangular shape which extends along the second direction Y. For example, the emission area each of the first to fourth subpixels SP1, SP2, SP3, and SP4 may have a vertical-horizontal division structure (or a four-division lattice pattern structure or a four-division tetragonal structure) by the first to fourth division regions DR1, DR2, DR3, and DR4. The first to fourth division regions DR1, DR2, DR3, and DR4 may have a same size (or area), but embodiments of the present disclosure are not limited thereto.

Each of the first and second division regions DR1 and DR2 may be an upper region (or a top region) of each of the first to fourth subpixels SP1, SP2, SP3, and SP4, and each of the third and fourth division regions DR3 and DR4 may be a lower region (or a bottom region) of each of the first to fourth subpixels SP1, SP2, SP3, and SP4.

With respect to the first direction X, a first pattern region PR1 of the first division region DR1 may be a left region of the first division region DR1, and a second pattern region PR2 of the first division region DR1 may be a right region of the first division region DR1.

With respect to the second direction Y, a first pattern region PR1 of the second division region DR2 may be a left region of the second division region DR2, and a second pattern region PR2 of the second division region DR2 may be a right region of the second division region DR2.

The phase grating portion PGP may include a first pattern region PR1 and a second pattern region PR2 disposed at each of the first and second division regions DR1 and DR2 of each of the first to fourth subpixels SP1, SP2, SP3, and SP4.

The first pattern region PR1 and the second pattern region PR2 of each of the first and second division regions DR1 and DR2 may have a same size (or area), or may have different sizes (or areas). For example, in each of the first and second division regions DR1 and DR2, the first pattern region PR1 and the second pattern region PR2 may have different refractive indexes, but embodiments of the present disclosure are not limited thereto. For example, in each of the first and second division regions DR1 and DR2, the first pattern region PR1 and the second pattern region PR2 may have a refractive index difference of 0.1 or more therebetween, but embodiments of the present disclosure are not limited thereto.

The phase grating portion PGP or the first pattern region PR1 and the second pattern region PR2 disposed at each of the first and second division regions DR1 and DR2 may be configured at a first buffer layer 112*a* of a buffer layer 112.

In each of the first and second division regions DR1 and DR2, the first pattern region PR1 may include the first buffer layer 112*a* and a second buffer layer 112*b* of the buffer layer 112, and the second pattern region PR2 may include a removal region 112*r* of the first buffer layer 112*a* of the buffer layer 112. The second pattern region PR2 of each of the first and second division regions DR1 and DR2 may include only the second buffer layer 112*b* of the buffer layer 112. Except for that the first pattern region PR1 and the second pattern region PR2 of each of the first and second division regions DR1 and DR2 are disposed or configured in each of the first and second division regions DR1 and DR2 of each of the first to fourth subpixels SP1, SP2, SP3, and SP4, the first pattern region PR1 and the second pattern region PR2 may be a same or substantially a same as the first pattern region PR1 and the second pattern region PR2 described above with reference to FIGS. 7 and 8, and thus, repeated descriptions thereof are omitted. The descriptions of the phase grating portion PGP or the first pattern region PR1 and the second pattern region PR2 illustrated in FIGS. 7 and 8 may be included in the descriptions of the phase grating portion PGP or the first pattern region PR1 and the second pattern region PR2 at each of the second pattern region PR2 of the first division region DR1 illustrated in FIGS. 14 and 15.

According to another embodiment of the present disclosure, any one of the first pattern region PR1 and the second pattern region PR2 of the first division region DR1 may be omitted, and any one of the first pattern region PR1 and the second pattern region PR2 of the second division region DR2 may be omitted. For example, the second pattern region PR2 may be omitted and the first division region DR1 may be configured with only the first pattern region PR1, and thus, all of the first division region DR1 may be configured with only the first pattern region PR1. For example, the first pattern region PR1 may be omitted and the second division region DR2 may be configured with only the second pattern region PR2, and thus, all of the second division region DR2 may be configured with only the second pattern region PR2.

The phase grating portion PGP may include a plurality of first pattern regions PR1 and a plurality of second pattern regions PR2, which are disposed at the third division region DR3 of each of the first to fourth subpixels SP1, SP2, SP3, and SP4.

The plurality of first pattern regions PR1 at the third division region DR3 may be disposed or configured at the third division region DR3 to have a certain interval along the first direction X and the second direction Y. For example, the plurality of first pattern regions PR1 at the third division region DR3 may be disposed or configured in a grating pattern shape or a checkered pattern shape. The plurality of second pattern regions PR2 at the third division region DR3 may be disposed or configured between the plurality of first pattern regions PR1 to have a certain interval along the first direction X and the second direction Y. For example, in the third division region DR3, the plurality of first pattern regions PR1 and the plurality of second pattern regions PR2 may have different refractive indexes, but embodiments of the present disclosure are not limited thereto. For example, in the third division region DR3, the plurality of first pattern regions PR1 and the plurality of second pattern regions PR2 may have a refractive index difference of 0.1 or more therebetween, but embodiments of the present disclosure are not limited thereto.

In the third division region DR3, each of the plurality of first pattern regions PR1 may include the first buffer layer 112*a* and a second buffer layer 112*b* of the buffer layer 112. The plurality of second pattern regions PR2 may include a removal region 112*r* of the first buffer layer 112*a* of the buffer layer 112. The plurality of second pattern regions PR2 may include only the second buffer layer 112*b* of the buffer layer 112. Except for that plurality of first pattern regions PR1 and the plurality of second pattern regions PR2 are disposed or configured at the third division region DR3 of each of the first to fourth subpixels SP1, SP2, SP3, and SP4, the plurality of first pattern regions PR1 and the plurality of second pattern regions PR2 may be a same or substantially a same as the plurality of first pattern regions PR1 and the plurality of second pattern regions PR2 described above with reference to FIG. 9, and thus, repeated descriptions thereof are omitted. The descriptions of the phase grating portion PGP or the plurality of first pattern regions PR1 and the plurality of second pattern regions PR2 illustrated in FIG. 9 may be included in the descriptions of the phase grating portion PGP or the plurality of first pattern regions PR1 and the plurality of second pattern regions PR2 at the third division region DR3 illustrated in FIGS. 14 and 15.

The phase grating portion PGP may include a plurality of first pattern regions PR1 and a plurality of second pattern regions PR2, which are disposed at the fourth division region DR4 of each of the first to fourth subpixels SP1, SP2, SP3, and SP4.

The plurality of first pattern regions PR1 at the fourth division region DR4 may be disposed in parallel to have a certain interval along the second direction Y and may be disposed to be staggered with one another along the first direction X. For example, the plurality of first pattern regions PR1 may be disposed to have a certain interval along a diagonal direction between the first direction X and the second direction Y. The second pattern region PR2 at the fourth division region DR4 may include a region between the plurality of first pattern regions PR1. For example, the second pattern region PR2 may include the other region, except the plurality of first pattern regions PR1, of the fourth division region DR4. For example, in the fourth division region DR4, the plurality of first pattern regions PR1 and the plurality of second pattern regions PR2 may have different refractive indexes, but embodiments of the present disclosure are not limited thereto. For example, in the fourth division region DR4, the plurality of first pattern regions PR1 and the plurality of second pattern regions PR2 may have a refractive index difference of 0.1 or more therebetween, but embodiments of the present disclosure are not limited thereto.

In the fourth division region DR4, each of the plurality of first pattern regions PR1 may include the first buffer layer 112*a* and a second buffer layer 112*b* of the buffer layer 112. The second pattern region PR2 may include a removal region 112*r* of the first buffer layer 112*a* of the buffer layer 112. The second pattern region PR2 may include only the second buffer layer 112*b* of the buffer layer 112. Except for that plurality of first pattern regions PR1 and the second pattern region PR2 are disposed or configured at the fourth division region DR4 of each of the first to fourth subpixels SP1, SP2, SP3, and SP4, the plurality of first pattern regions PR1 and the second pattern region PR2 may be a same or substantially a same as the plurality of first pattern regions PR1 and the second pattern region PR2 described above with reference to FIGS. 10 and 11, and thus, repeated descriptions thereof are omitted. The descriptions of the phase grating portion PGP or the plurality of first pattern regions PR1 and the second pattern region PR2 illustrated in FIGS. 10 and 11 may be included in the descriptions of the phase grating portion PGP or the plurality of first pattern regions PR1 and the second pattern region PR2 at the fourth division region DR4 illustrated in FIGS. 14 and 15.

According to another embodiment of the present disclosure, in the fourth division region DR4, except for that a plurality of first pattern regions PR1 and a second pattern region PR2 are disposed or configured at the fourth division region DR4 of each of first to fourth subpixels SP1, SP2, SP3, and SP4, the plurality of first pattern regions PR1 and the second pattern region PR2 may be a same as or substantially a same as the plurality of first pattern regions PR1 and the second pattern region PR2 described above with reference to FIG. 12 or 13, and thus, repeated descriptions thereof are omitted. The descriptions of the phase grating portion PGP or the plurality of first pattern regions PR1 and the second pattern region PR2 illustrated in FIG. 12 or 13 may be included in the descriptions of the phase grating portion PGP or the plurality of first pattern regions PR1 and the second pattern region PR2 at the fourth division region DR4 illustrated in FIGS. 14 and 15.

As described above, the phase grating portion PGP according to another embodiment of the present disclosure may include the plurality of first pattern regions PR1 and the plurality of second pattern regions PR2, which are configured at each of the plurality of division regions DR1, DR2, DR3, and DR4 in the first to fourth subpixels (or the plurality of subpixels) SP1, SP2, SP3, and SP4 of each of the plurality of pixels P, and thus, may optically divide (or separate) reflection light reflected from the light extraction pattern 140 at each of the plurality of division regions DR1, DR2, DR3, and DR4 to increase the irregularity or randomness of a diffraction pattern of the reflection light, and thus, the occurrence of rainbow Mura where reflection light is spread in a radial shape and/or circular ring Mura where reflection light is spread in a radial shape may be better prevented or more minimized based on a diffraction characteristic of each of the reflection lights reflected from the light extraction patterns 140.

Figure 16:
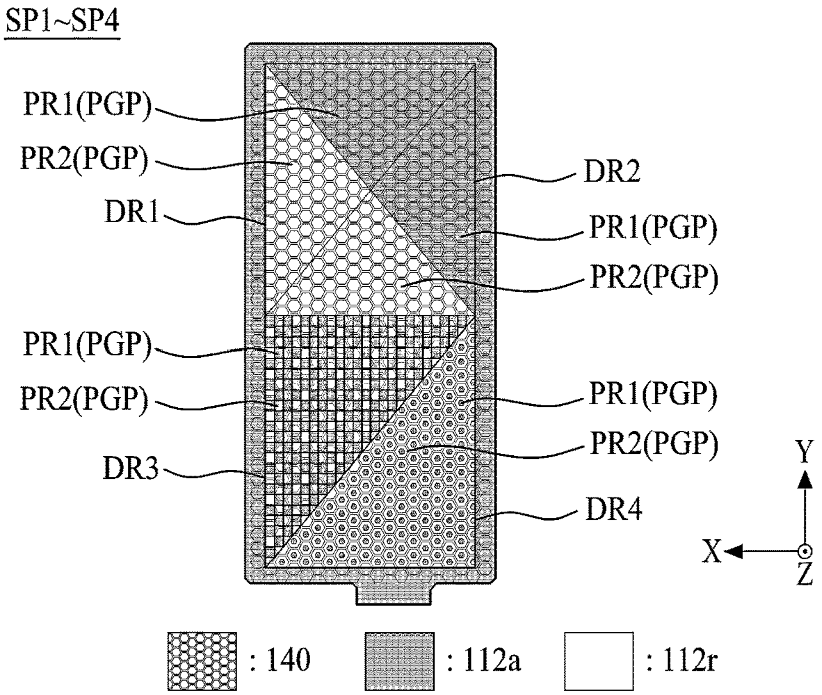
FIG. 16 is another diagram illustrating the enlargement of the subpixel illustrated in FIG. 14.

FIG. 16 is another diagram illustrating the enlargement of the subpixel illustrated in FIG. 14. FIG. 16 illustrates an embodiment implemented by modifying a division region described above with reference to FIGS. 14 and 15. Therefore, in the following description, the descriptions of the other elements except the division region may be the same as the descriptions of FIGS. 14 and 15, and thus, repeated descriptions are omitted or will be briefly given.

Referring to FIGS. 14 and 15, first to fourth division regions (or a plurality of division regions) DR1, DR2, DR3, and DR4 according to another embodiment of the present disclosure may be disposed along one or more direction of a first direction X, a second direction Y crossing the first direction X, and a diagonal direction between the first direction X and the second direction Y within an emission area of each of first to fourth subpixels SP1, SP2, SP3, and SP4. For example, the first to fourth division regions DR1, DR2, DR3, and DR4 may be disposed along the second direction Y and the diagonal direction within the emission area of each of first to fourth subpixels SP1, SP2, SP3, and SP4.

According to another embodiment of the present disclosure, each of the first to fourth division regions DR1, DR2, DR3, and DR4 may have a triangular shape. For example, each of the first to fourth division regions DR1, DR2, DR3, and DR4 may have a same size (or area) or different sizes (or area), but embodiments of the present disclosure are not limited thereto. For example, the emission area of each of first to fourth subpixels SP1, SP2, SP3, and SP4 may have a diagonal division structure (or a four-division triangular structure) by the first to fourth division regions DR1, DR2, DR3, and DR4. The first to fourth division regions DR1, DR2, DR3, and DR4 may have a same size (or area) or different sizes (or area).

The phase grating portion PGP may include one or more first pattern region PR1 and one or more second pattern region PR2 disposed at each of the first and second division regions DR1 and DR2 of each of the first to fourth subpixels SP1, SP2, SP3, and SP4. For example, the phase grating portion PGP may include a first pattern region PR1 and a second pattern region PR2 disposed at each of the first and second division regions DR1 and DR2 of each of the first to fourth subpixels SP1, SP2, SP3, and SP4.

Each of the first pattern region PR1 and the second pattern region PR2 of each of the first and second division regions DR1 and DR2 may have a triangular shape. The first pattern region PR1 and the second pattern region PR2 of each of the first and second division regions DR1 and DR2 may have a same size (or area), or may have different sizes (or areas).

Except for that the first pattern region PR1 and the second pattern region PR2 of each of the first and second division regions DR1 and DR2 are disposed or configured at each of the first and second division regions DR1 and DR2 having the triangular shape, the first pattern region PR1 and the second pattern region PR2 may be a same as or substantially a same as the first pattern region PR1 and the second pattern region PR2 described above with reference to FIG. 15, and thus, repeated descriptions thereof are omitted. The descriptions of the phase grating portion PGP or the first pattern region PR1 and the second pattern region PR2 illustrated in FIG. 15 may be included in the descriptions of the phase grating portion PGP or the first pattern region PR1 and the second pattern region PR2 at each of the first and second division regions DR1 and DR2 illustrated in FIG. 16.

According to another embodiment of the present disclosure, any one of the first pattern region PR1 and the second pattern region PR2 of the first division region DR1 may be omitted, and any one of the first pattern region PR1 and the second pattern region PR2 of the second division region DR2 may be omitted. For example, the second pattern region PR2 may be omitted and the first division region DR1 may be configured with only the first pattern region PR1, and thus, all of the first division region DR1 may be configured with only the first pattern region PR1. For example, the first pattern region PR1 may be omitted and the second division region DR2 may be configured with only the second pattern region PR2, and thus, all of the second division region DR2 may be configured with only the second pattern region PR2.

The phase grating portion PGP may include one or more first pattern regions PR1 and one or more second pattern regions PR2, which are disposed at the third division region DR3 of each of the first to fourth subpixels SP1, SP2, SP3, and SP4. For example, the phase grating portion PGP may include a plurality of first pattern regions PR1 and a plurality of second pattern regions PR2, which are disposed at the third division region DR3 of each of the first to fourth subpixels SP1, SP2, SP3, and SP4.

The plurality of first pattern regions PR1 at the third division region DR3 may be disposed or configured in a grating pattern shape or a checkered pattern shape. The plurality of second pattern regions PR2 at the third division region DR3 may be disposed or configured between the plurality of first pattern regions PR1 to have a certain interval along the first direction X and the second direction Y.

Except for that the plurality of first pattern regions PR1 and the plurality of second pattern regions PR2 at the third division region DR3 are disposed or configured at each of the first and second division regions DR1 and DR2 having the triangular shape, the plurality of first pattern regions PR1 and the plurality of second pattern regions PR2 may be a same as or substantially a same as the plurality of first pattern regions PR1 and the plurality of second pattern regions PR2 described above with reference to FIG. 15, and thus, repeated descriptions thereof are omitted. The descriptions of the phase grating portion PGP or the plurality of first pattern regions PR1 and the plurality of second pattern regions PR2 illustrated in FIG. 15 may be included in the descriptions of the phase grating portion PGP or the plurality of first pattern regions PR1 and the plurality of second pattern regions PR2 at the third division region DR3 illustrated in FIG. 16.

The phase grating portion PGP may include one or more first pattern regions PR1 and one or more second pattern regions PR2, which are disposed at the fourth division region DR4 of each of the first to fourth subpixels SP1, SP2, SP3, and SP4. For example, the phase grating portion PGP may include a plurality of first pattern regions PR1 and a second pattern region PR2, which are disposed at the fourth division region DR4 of each of the first to fourth subpixels SP1, SP2, SP3, and SP4.

The plurality of first pattern regions PR1 at the fourth division region DR4 may be disposed in parallel to have a certain interval along the second direction Y and may be disposed to be staggered with one another along the first direction X. The second pattern region PR2 the fourth division region DR4 may include a region between the plurality of first pattern regions PR1.

Except for that the plurality of first pattern regions PR1 and the second pattern region PR2 at the fourth division region DR4 are disposed or configured at each of the fourth division region DR4 having the triangular shape, the plurality of first pattern regions PR1 and the second pattern region PR2 may be a same as or substantially a same as the plurality of first pattern regions PR1 and the second pattern region PR2 described above with reference to FIG. 15, and thus, repeated descriptions thereof are omitted. The descriptions of the phase grating portion PGP or the one or more first pattern regions PR1 and the second pattern region PR2 illustrated in FIG. 15 may be included in the descriptions of the phase grating portion PGP or the one or more first pattern regions PR1 and the second pattern region PR2 at the fourth division region DR4 illustrated in FIG. 16. For example, in the one or more first pattern regions PR1 and the one or more second pattern regions PR2 configured at each of the first to fourth division regions DR1, DR2, DR3 and DR4, the one or more first pattern regions PR1 may comprise all of the first buffer layer (the insulation layer) 112*a* and the second buffer layer (the insulation layer) 112*b*, and the one or more second pattern regions PR2 may comprise only the second buffer layer 112*b*, or comprises a region (the removal region 112*r*) from which all of the first buffer layer 112*a* and the second buffer layer 112*b* have been removed.

As described above, the phase grating portion PGP according to another embodiment of the present disclosure may have or provide a same effect as that of the phase grating portion PGP described above with reference to FIG. 15.

Figure 17:
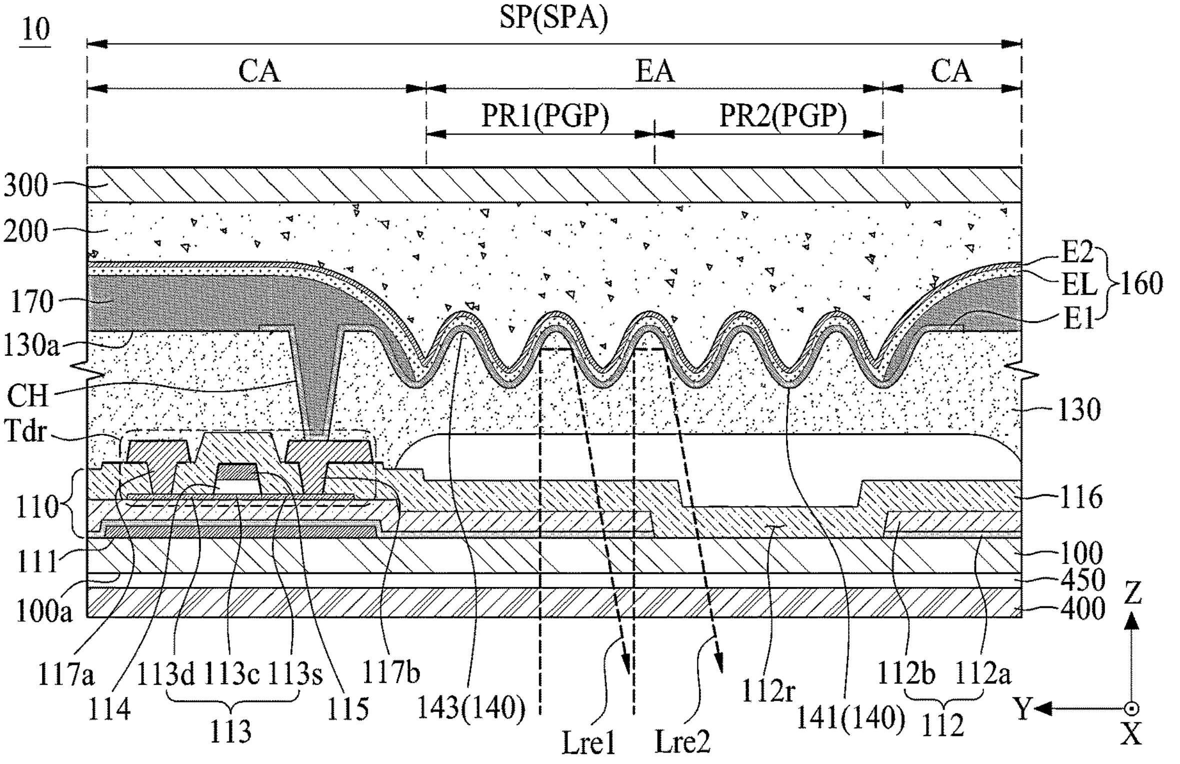
FIG. 17 is another diagram illustrating the enlargement of the subpixel illustrated in FIG. 14.

FIG. 17 is a cross-sectional view illustrating a cross-sectional structure of one subpixel according to another embodiment of the present disclosure. FIG. 17 illustrates an embodiment implemented by modifying the phase grating portion in the organic light emitting display apparatus or the display panel described above with reference to FIGS. 1 to 6. Therefore, in the following description, the descriptions of the other elements except a phase grating portion and relevant elements may be the same as the descriptions of FIGS. 1 and 6, and thus, repeated descriptions are omitted or will be briefly given.

Referring to FIG. 17, a phase grating portion PGP according to another embodiment (or a sixth embodiment) of the present disclosure may include a plurality of pattern regions PR1 and PR2 or a first pattern region PR1 and a second pattern region PR2, which are provided between a substrate 100 and a light extraction pattern 140 to overlap an emission area EA.

The first and second pattern regions (or the plurality of pattern regions) PR1 and PR2 may be formed or configured at a buffer layer 112 between the substrate 100 and the light extraction pattern 140 to overlap the emission area EA.

The first pattern region PR1 may be configured to include all of the first buffer layer 112*a* and the second buffer layer 112*b* which are disposed between the light extraction pattern 140 and the substrate 100 to overlap the light extraction pattern 140. The first pattern region PR1 may be a same or substantially a same as the first pattern region PR1 described above with reference to FIGS. 3 to 6, and thus, repeated descriptions thereof are omitted.

The second pattern region PR2 may be a removal region 112*r*, from which all of the buffer layer 112 has been removed, of a region overlapping the emission area EA. The second pattern region PR2 may be the removal region 112*r*, from which all of a first buffer layer 112*a* and a second buffer layer 112*b* have been removed, of the region overlapping the emission area EA. For example, the second pattern region PR2 may be the removal region 112*r* which is a non-formation region (or a non-disposition region) 112*r* of the buffer layer 112 at the region overlapping the emission area EA between the substrate 100 and the light extraction pattern 140. For example, the second pattern region PR2 may be a contact region or a direct contact region between the passivation layer 116 and the substrate 100 at a region overlapping the emission area EA between the light extraction pattern 140 and the substrate 100. Accordingly, second reflection light Lre2 reflected from the light extraction pattern 140 to the second pattern region PR2 may be refracted by a refractive index difference between the passivation layer 116 and the substrate 100, or may be output to the outside of the substrate 100 through a light path based on the refractive index difference between the passivation layer 116 and the substrate 100.

According to an embodiment of the present disclosure, the first reflection light Lre1 reflected from the light extraction pattern 140 to the first pattern region PR1 and second reflection light Lre2 reflected from the light extraction pattern 140 to the second pattern region PR2 may have a phase difference and/or a light path difference therebetween, and thus, the irregularity or randomness of a diffraction pattern of reflection light reflected from the light extraction pattern 140 may increase. For example, a phase and/or a light path of the first reflection light Lre1 which is reflected from the light extraction pattern 140 and passes through the passivation layer 116 of the first pattern region PR1 may differ from a phase and/or a light path of the second reflection light Lre2 which is reflected from the light extraction pattern 140 and passes through the second pattern region PR2 without passing through the passivation layer 116 of the first pattern region PR1, and thus, the reflection lights reflected from the light extraction pattern 140 may be optically divided (or separated) by the first pattern region PR1 and the second pattern region PR2, thereby increasing the irregularity or randomness of a diffraction pattern of the reflection light reflected from the light extraction pattern 140.

According to an embodiment of the present disclosure, in the first pattern region PR1 disposed at each of the first to fourth subpixels SP1, SP2, SP3, and SP4, the first buffer layer 112*a* may be configured to have a thickness T1, T2, T3, and T4 corresponding to a path difference ΔX, except an integer multiple of a wavelength 2, of a path difference ΔX between the first reflection light Lre1 passing through the first pattern region PR1 and the second reflection light Lre2 passing through the second pattern region PR2, based on the described above Equation 1.

According to an embodiment of the present disclosure, a path difference ΔX between the first reflection light Lre1 passing through the first pattern region PR1 configured as the first buffer layer 112*a* having a refractive index of 1.8 and a thickness of 100 nm and the second reflection light Lre2 passing through the second pattern region PR2 configured as only the second buffer layer 112*b* having a refractive index of 1.5 without passing through the first buffer layer 112*a* may be 70 nm to 100 nm, but embodiments according to present disclosure are not limited thereto.

As described above, the phase grating portion PGP according to an embodiment of the present disclosure may include the first pattern region PR1 and the second pattern region PR2, which have different refractive indexes or provide different light paths of the reflection lights Lre1 and Lre2, and thus, may optically divide (or separate) the reflection lights Lre1 and Lre2 reflected from the light extraction pattern 140 to increase the irregularity or randomness of a diffraction pattern of each of the reflection lights Lre1 and Lre2, and thus, the occurrence of rainbow Mura where reflection light is spread in a radial shape and/or circular ring Mura where reflection light is spread in a radial shape may be prevented or minimized based on a diffraction characteristic of reflection light reflected from the light extraction pattern 140.

The phase grating portion PGP or the first pattern region PR1 and the second pattern region PR2 described above with reference to FIG. 17 may be identically applied to the phase grating portion PGP or the first pattern region PR1 and the second pattern region PR2 illustrated in FIGS. 7 to 16, and thus, repeated descriptions thereof are omitted. For example, the phase grating portion PGP may comprise a plurality of first pattern regions PR1 disposed in a grating pattern shape and a second pattern region PR2 between the plurality of first pattern regions PR1. Each of the plurality of second pattern regions PR2 may comprise a region (the removal region 112*r*) from which all of the first buffer layer (the first insulation layer) 112*a* and the second buffer layer (the second insulation layer) 112*b* have been removed.

Figure 18:
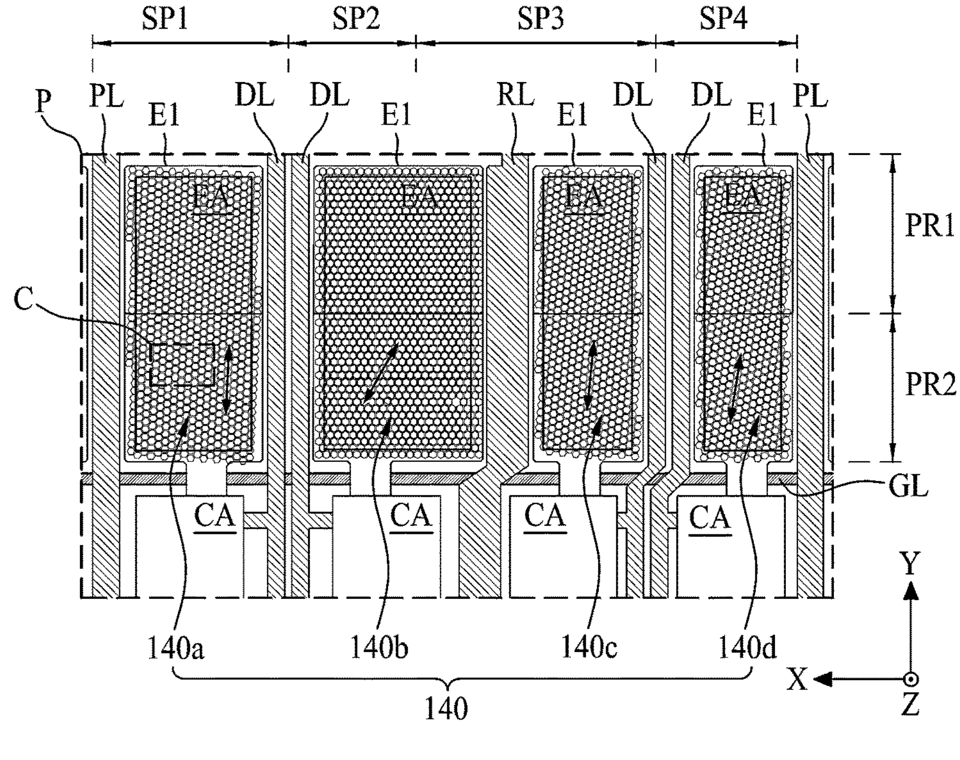
FIG. 18 is a plan view illustrating a pixel according to another embodiment of the present disclosure.

FIG. 18 is a plan view illustrating a pixel according to another embodiment of the present disclosure. FIG. 18 illustrates an embodiment implemented by modifying the light extraction pattern described above with reference to FIGS. 1 to 17. Therefore, in the following description, the descriptions of the other elements except a light extraction pattern and relevant elements may be the same as the descriptions of FIGS. 1 to 17, and thus, repeated descriptions are omitted or will be briefly given. In FIG. 18, a bidirectional arrow illustrated in a subpixel represents a rotation angle (or a rotation direction) of a light extraction pattern.

Referring to FIG. 18, each of first to fourth subpixels SP1, SP2, SP3, and SP4 of each of a plurality of pixels P according to another embodiment of the present disclosure may include a light extraction pattern 140.

The light extraction pattern 140 configured at each of the first to fourth subpixels SP1, SP2, SP3, and SP4 may rotate (or horizontally rotate) or reversely rotate (or horizontally and reversely rotate) with respect to a reference point within a corresponding emission area EA. For example, the reference point may be an arbitrary point or one point of the emission area EA.

One or more of light extraction patterns 140 configured at each of the first to fourth subpixels SP1, SP2, SP3, and SP4 may be rotated or reversely rotated by different angles. For example, the first to fourth light extraction patterns 140*a*, 140*b*, 140*c*, and 140*d* may be rotated or reversely rotated by different angles. For example, the light extraction patterns 140 configured at each of the first to fourth subpixels SP1, SP2, SP3, and SP4 at one pixel P may be rotated by different angles from each other. For example, rotation angles of light extraction patterns 140 disposed an adjacent pixel P may be different from each other.

According to an embodiment of the present disclosure, external light may be reflected by a rotated light extraction pattern 140 of each of the first to fourth subpixels SP1, SP2, SP3, and SP4. The rotated light extraction pattern 140 may change a diffraction path of incident light to a vertical direction and may generate a diffraction pattern (or a diffraction pattern distribution) having maximum intensity in a specific order instead of a $0^{th}$ diffraction order, and thus, diffraction patterns (or diffraction pattern distributions) occurring due to the constructive interference of reflection light reflected from the light extraction pattern 140 may be offset or minimized. Constructive interference between diffraction patterns (or diffraction pattern distributions) may be offset due to the irregularity or randomness of a rotation angle of the light extraction pattern 140.

The light extraction pattern 140 may include first to fourth light extraction patterns 140*a*, 140*b*, 140*c*, and 140*d*.

The first light extraction pattern 140*a* may be disposed or configured at the first subpixel SP1 of each of the plurality of pixels P. The second light extraction pattern 140*b* may be disposed or configured at the second subpixel SP2 of each of the plurality of pixels P. The third light extraction pattern 140*c* may be disposed or configured at the third subpixel SP3 of each of the plurality of pixels P. The fourth light extraction pattern 140*d* may be disposed or configured at the fourth subpixel SP4 of each of the plurality of pixels P.

Each of the first to fourth light extraction patterns 140*a*, 140*b*, 140*c*, and 140*d* may be rotated or reversely rotated with respect to a reference point within a corresponding emission area EA. One or more of the first to fourth light extraction patterns 140*a*, 140*b*, 140*c*, and 140*d* may be rotated or reversely rotated by different angles. For example, the first to fourth light extraction patterns 140*a*, 140*b*, 140*c*, and 140*d* may be rotated or reversely rotated by different angles form each other. For example, the first to fourth light extraction patterns 140*a*, 140*b*, 140*c*, and 140*d* which is disposed at each of the first to fourth subpixels SP1, SP2, SP3, and SP4 at one pixel P may be rotated by different angles form each other. For example, rotation angles of each of the first to fourth subpixels SP1, SP2, SP3, and SP4 may differ from each other by pixel units. For example, rotation angles of light extraction patterns 140*a*, 140*b*, 140*c*, and 140*d* disposed at a same adjacent subpixels SP1, SP2, SP3, and SP4 may differ from each other. For example, some of the light extraction patterns 140 may be rotated by a same rotation angles based on the number of pixels P disposed at the display area. For example, the light extraction patterns 140 which have rotated by a same rotation angles may be separated from one another by an interval corresponding to the plurality of pixels P, at the display area.

According to another embodiment of the present disclosure, the irregularity or randomness of a diffraction pattern of reflection light reflected form the light extraction pattern 140 may increase based on a rotation angle of the light extraction pattern 140 and may more increase due to a phase difference and/or a light path difference between reflection lights caused by the first pattern region PR1 and the second pattern region PR2 of the phase grating portion PGP.

The light extraction patterns 140*a*, 140*b*, 140*c*, and 140*d* described above with reference to FIGS. 1 to 17 may be changed to the rotated light extraction patterns 140*a*, 140*b*, 140*c*, and 140*d* described above with reference to FIG. 18.

Therefore, the organic light emitting display apparatus or the display panel according to another embodiment of the present disclosure may include the first pattern region PR1 and the second pattern region PR2 and the light extraction patterns 140*a*, 140*b*, 140*c*, and 140*d* which have rotated with respect to an arbitrary reference point in the subpixels SP1, SP2, SP3, and SP4, and thus, the irregularity or randomness of a diffraction pattern of reflection light reflected from the light extraction pattern 140 may more increase. Accordingly, the occurrence of rainbow Mura where reflection light is spread in a radial shape and/or circular ring Mura where reflection light is spread in a radial shape may be better prevented or more minimized based on the diffraction characteristic of reflection light reflected from the light extraction pattern 140 of the display area. For example, a black visibility characteristic or a black color (or black rising) phenomenon caused by the reflection of external light may be reduced in a non-driving or off state of the organic light emitting display apparatus or the display panel 10, thereby implementing real black.

Figure 19:
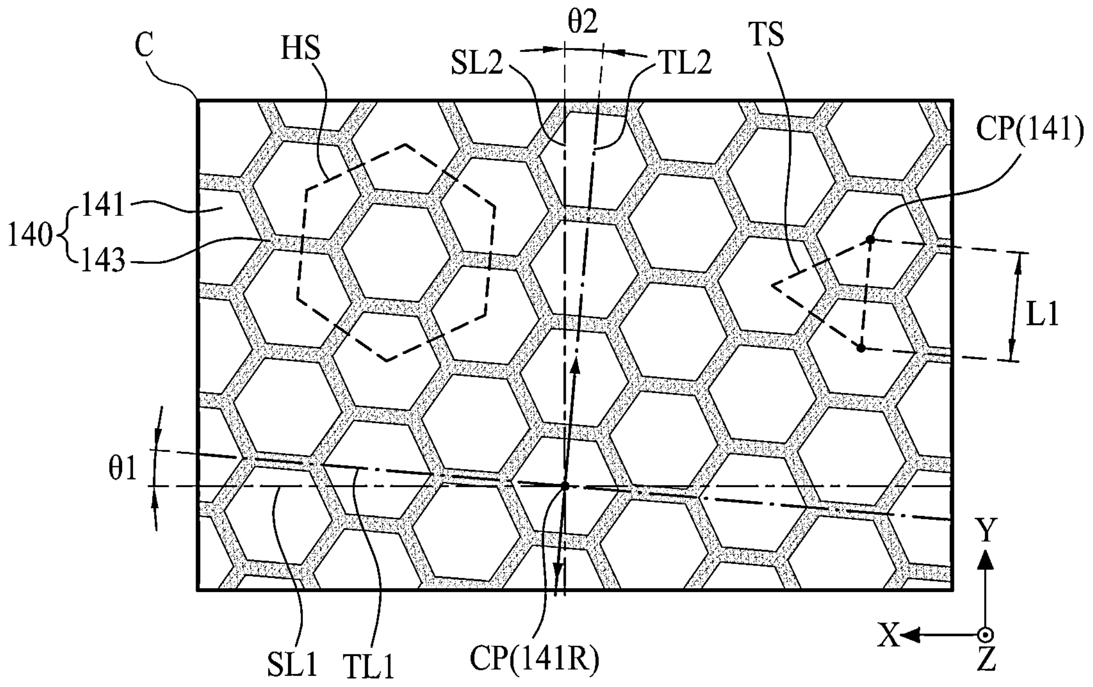
FIG. 19 is an enlarged view of a region 'C' illustrated in FIG. 18.

FIG. 19 is an enlarged view of a region 'C' illustrated in FIG. 18. FIG. 19 is a diagram illustrating a rotation structure of a light extraction pattern illustrated in FIG. 18. Therefore, in the following description, the descriptions of the other elements except a rotation structure of a light extraction pattern may be the same as the descriptions of FIG. 4, and thus, repeated descriptions are omitted or will be briefly given.

Referring to FIGS. 18 and 19, the light extraction pattern 140 or each of first to fourth light extraction patterns 140*a*, 140*b*, 140*c*, and 140*d* according to another embodiment of the present disclosure may be configured to be rotated (or horizontally rotate) or reversely rotated (or horizontally and reversely rotate) with respect to the arbitrary reference point within an emission area EA (or a subpixel area) of each of the first to fourth subpixels SP1, SP2, SP3, and SP4. For example, when the concave portion 141 or the convex portions 143 has a planar structure having a hexagonal shape (or a honeycomb shape), a rotation angle of the light extraction pattern 140 may be set to within a range of 0 degrees to 60 degrees. For example, the arbitrary reference point may be an arbitrary position within the emission area EA (or a subpixel area) of each of the first to fourth subpixels SP1, SP2, SP3, and SP4 in the pixel P, or may be a center portion CP of any one of the plurality of concave portions 141.

According to an embodiment of the present disclosure, when the concave portion 141 or the convex portions 143 has a planar structure having a hexagonal shape (or a honeycomb shape), a case where the light extraction pattern 140 rotates by 60 degrees, 120 degrees, 180 degrees, 240 degrees, 300 degrees, or 360 degrees with respect to the arbitrary reference point may be configured to be equal to a case where the light extraction pattern 140 does not rotate with respect to the arbitrary reference point. Accordingly, when the concave portion 141 has a planar structure having a hexagonal shape (or a honeycomb shape), a rotation angle of the light extraction pattern 140 may be greater than 0 degrees and less than 60 degrees.

According to a rotation structure (or rotation arrangement) of the light extraction pattern 140, when a center portion CP of an arbitrary reference concave portion 141R of a plurality of concave portions 141 disposed along a first direction X is positioned at or aligned with a first straight line SL1 parallel to the first direction X, a center portion CP of each of a plurality of other concave portions 141 adjacent to the reference concave portion 141R may not be positioned at or aligned with the first straight line SL1.

According to a rotation structure (or rotation arrangement) of the light extraction pattern 140, when a center portion CP of an arbitrary reference concave portion 141R of a plurality of concave portions 141 disposed along a second direction Y is positioned at or aligned with a second straight line SL2 parallel to the second direction Y, a center portion CP of each of a plurality of other concave portions 141 adjacent to the reference concave portion 141R may not be positioned at or aligned with the second straight line SL2.

According to an embodiment of the present disclosure, the center portion CP of each of the plurality of concave portions 141 disposed at the first direction X may be positioned or aligned at the first tilt line TL1 intersecting with the first straight line SL1. Furthermore, the center portion CP of each of the plurality of concave portions 141 disposed at the second direction Y may be positioned or aligned at the second tilt line TL2 intersecting with the second straight line SL2.

The first tilt line TL1 may be sloped or inclined by a first angle θ1 from the first straight line SL1. For example, the first angle θ1 may be more than 0 degrees and less than 60 degrees (0 degrees≤θ1<60 degrees) or greater than 0 degrees and smaller than 60 degrees (0 degrees<θ1≤60 degrees). The first tilt line TL1 according to an embodiment of the present disclosure may be sloped or inclined from the first straight line SL1 and may pass through a center portion CP of rotated concave portions 141, and thus, the first tilt line TL1 may be a first center connection line or a first center extension line. The first tilt line TL1 according to another embodiment of the present disclosure may be sloped or inclined from the first straight line SL1 and may pass through ends of rotated concave portions 141, and thus, the first tilt line TL1 may be a first end connection line or a first end extension line.

According to an embodiment of the present disclosure, when the plurality of concave portions 141 are arranged in a honeycomb structure, the first tilt line TL1 according to an embodiment of the present disclosure may be sloped or inclined from the first straight line SL1 and may pass through two vertexes facing each other and a center portion CP at each of the plurality of concave portions 141. Furthermore, the first tilt line TL1 according to another embodiment of the present disclosure may be sloped or inclined from the first straight line SL1 and may pass through any one of first to sixth sides of each of the plurality of concave portions 141. For example, an angle between the first tilt line TL1 and a side intersecting with the first tilt line TL1 among the first to sixth sides of each of the plurality of concave portions 141 may be 60 degrees.

The second tilt line TL2 may be sloped or inclined by a second angle θ2 from a second straight line SL2. For example, the second angle θ2 may be more than 0 degrees and less than 60 degrees (0 degrees≤θ2<60 degrees) or greater than 0 degrees and smaller than 60 degrees (0 degrees<θ2≤60 degrees). For example, the second angle θ2 may be equal to a first angle θ1. The second tilt line TL2 according to an embodiment of the present disclosure may be sloped or inclined from the second straight line SL2 and may pass through a center portion CP of rotated concave portions 141, and thus, the second tilt line TL2 may be a second center connection line or a second center extension line. The second tilt line TL2 according to another embodiment of the present disclosure may be sloped or inclined from the second straight line SL2 and may pass through ends of rotated concave portions 141, and thus, the second tilt line TL2 may be a second end connection line or a second end extension line.

According to an embodiment of the present disclosure, when the plurality of concave portions 141 are arranged in a honeycomb structure, the second tilt line TL2 according to an embodiment of the present disclosure may be sloped or inclined from the second straight line SL2 and may pass through the center portion CP and a center of each of two sides facing each other in each of the plurality of concave portions 141. Furthermore, the second tilt line TL2 according to another embodiment of the present disclosure may be sloped or inclined from the second straight line SL2 and may pass through one of first to sixth vertexes of each of the plurality of concave portions 141. For example, an angle between the second tilt line TL2 and a side intersecting with the second tilt line TL2 among the first to sixth sides of each of the plurality of concave portions 141 may be 30 degrees or 90 degrees.

Figure 20A:
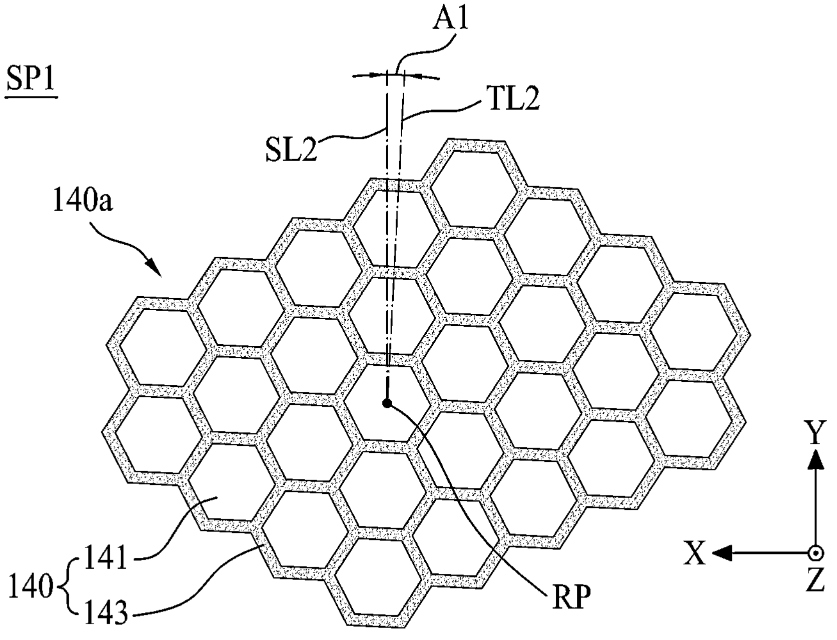
FIG. 20A is a diagram illustrating a rotation structure of a first light extraction pattern illustrated in FIG. 18.
Figure 20B:
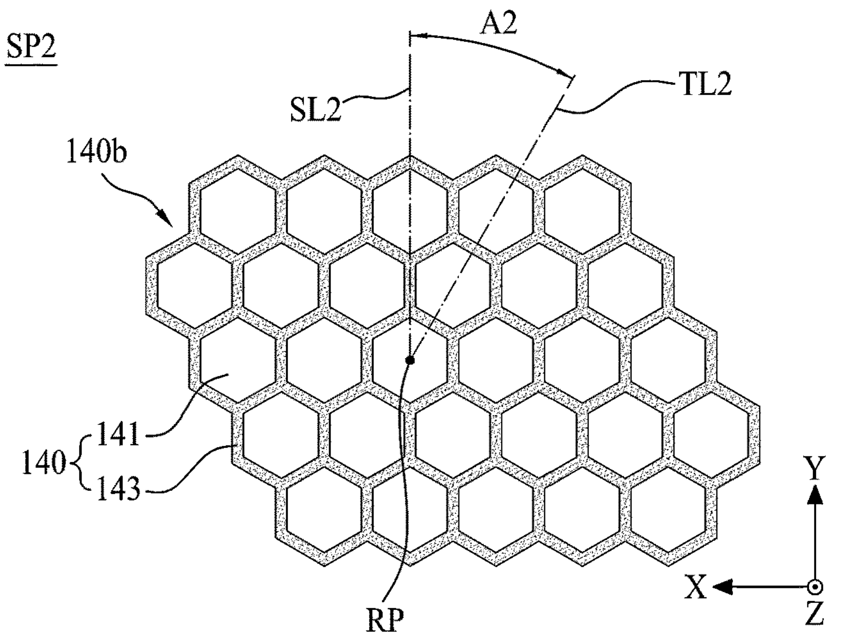
FIG. 20B is a diagram illustrating a rotation structure of a second light extraction pattern illustrated in FIG. 18.
Figure 20C:
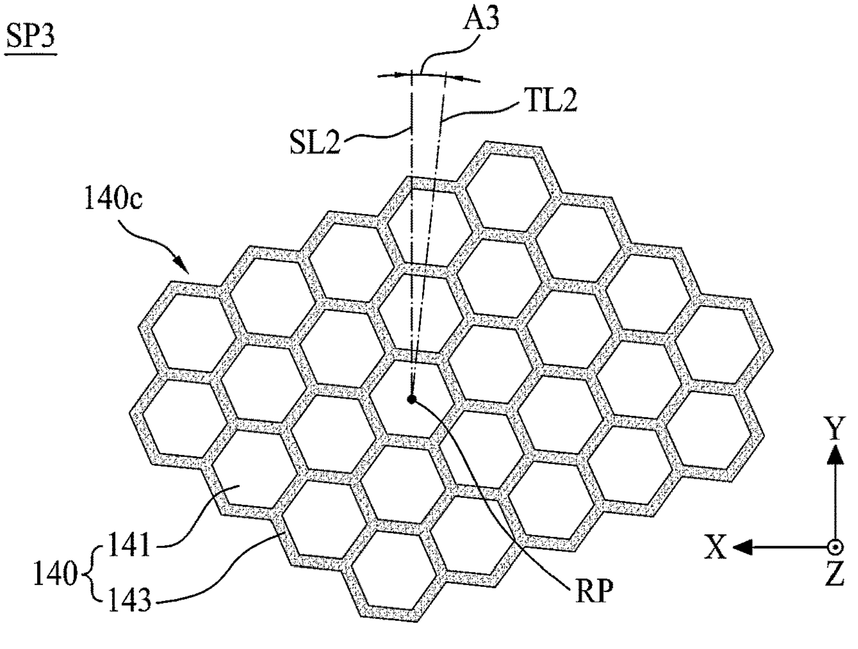
FIG. 20C is a diagram illustrating a rotation structure of a third light extraction pattern illustrated in FIG. 18.
Figure 20D:
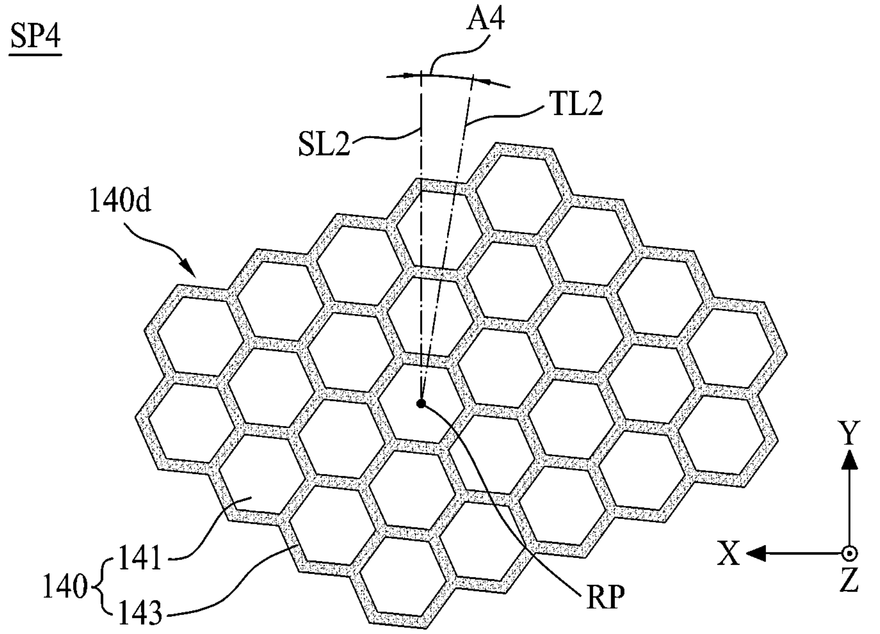
FIG. 20D is a diagram illustrating a rotation structure of a fourth light extraction pattern illustrated in FIG. 18.

FIG. 20A is a diagram illustrating a rotation structure of a first light extraction pattern illustrated in FIG. 18. FIG. 20B is a diagram illustrating a rotation structure of a second light extraction pattern illustrated in FIG. 18. FIG. 20C is a diagram illustrating a rotation structure of a third light extraction pattern illustrated in FIG. 18. FIG. 20D is a diagram illustrating a rotation structure of a fourth light extraction pattern illustrated in FIG. 18.

Referring to FIG. 20A, a first light extraction pattern 140*a* at a first subpixel SP1 may be rotated by a rotation angle A1 of 3 degrees with respect to an arbitrary reference point RP. For example, a rotation angle A1 of the first light extraction pattern 140*a* may be an angle between a second straight line SL2 and a second tilt line TL2.

Referring to FIG. 20B, a second light extraction pattern 140*b* at a second subpixel SP2 may be rotated by a rotation angle A2 of 30 degrees with respect to an arbitrary reference point RP. For example, a rotation angle A2 of the second light extraction pattern 140*b* may be an angle between the second straight line SL2 and the second tilt line TL2.

Referring to FIG. 20C, a third light extraction pattern 140*c* at a third subpixel SP3 may be rotated by a rotation angle A3 of 6 degrees with respect to an arbitrary reference point RP. For example, a rotation angle A3 of the third light extraction pattern 140*c* may be an angle between the second straight line SL2 and the second tilt line TL2.

Referring to FIG. 20D, a fourth light extraction pattern 140*d* at a fourth subpixel SP4 may be rotated by a rotation angle A4 of 9 degrees with respect to an arbitrary reference point RP. For example, a rotation angle A4 of the fourth light extraction pattern **140*d* may be an angle between the second straight line SL2 and the second tilt line TL2**.

As described above, according to another embodiment of the present disclosure, each of the first to fourth subpixels SP1, SP2, SP3, and SP4 may include the first to fourth light extraction patterns **140*a*, 140*b*, 140*c*, and 140*d*, the first pattern region PR1, and the second pattern region PR2 which are rotated by different rotation angles, and thus, the regularity of reflection light reflected by the first to fourth light extraction patterns 140*a*, 140*b*, 140*c*, and 140*d*** may more decrease or the randomness of the reflection light may more increase, thereby more preventing or more minimizing the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be more reduced in a non-driving or off state.

An organic light emitting display apparatus according to an embodiment of the present disclosure will be described below.

An organic light emitting display apparatus according to an embodiment of the present disclosure may comprise a plurality of pixels on a substrate, each including a plurality of subpixels each having an emission area, a planarization layer including a light extraction pattern which is at the emission area of each of the plurality of subpixels and includes a plurality of concave portions and a convex portion surrounding each of the plurality of concave portions, a light emitting device layer on the light extraction pattern, and a phase grating portion between the substrate and the light extraction pattern to overlap the emission area of each of the plurality of subpixels.

According to one or more embodiments of the present disclosure, the phase grating portion may comprise a plurality of pattern regions, configured to change a light path and/or a phase of reflection light reflected from the light extraction pattern based on a refractive index difference or a dielectric constant difference.

According to one or more embodiments of the present disclosure, the plurality of pattern regions may have a refractive index difference therebetween.

According to one or more embodiments of the present disclosure, the plurality of pattern regions may have a refractive index difference of 0.1 or more therebetween.

According to one or more embodiments of the present disclosure, the organic light emitting display apparatus may further comprise an insulation layer between the substrate and the light extraction pattern, the phase grating portion may be configured at the insulation layer.

According to one or more embodiments of the present disclosure, the insulation layer may comprise a first insulation layer having a first refractive index, and a second insulation layer having a second refractive index which differs from the first refractive index, the second insulation layer being stacked on the first insulation layer.

According to one or more embodiments of the present disclosure, the phase grating portion may comprise a first pattern region and a second pattern region, the first pattern region may comprise all of the first insulation layer and the second insulation layer, and the second pattern region may comprise only the second insulation layer of the first insulation layer and the second insulation layer, or may comprise a region from which all of the first insulation layer and the second insulation layer have been removed.

According to one or more embodiments of the present disclosure, first insulation layers of the first pattern region respectively at the plurality of subpixels may have different thicknesses.

According to one or more embodiments of the present disclosure, the second pattern region may comprise only the second insulation layer, and the second insulation layer may contact the substrate at the second pattern region.

According to one or more embodiments of the present disclosure, the organic light emitting display apparatus may further comprise a passivation layer between the insulation layer and the light extraction pattern, the second pattern region may comprise a region from which all of the first insulation layer and the second insulation layer have been removed, and the passivation layer may contact the substrate at the second pattern region.

According to one or more embodiments of the present disclosure, the phase grating portion may comprise a plurality of first pattern regions disposed in a grating pattern shape, and a plurality of second patterns region between the plurality of first pattern regions, respectively, each of the plurality of first pattern regions may comprise all of the first insulation layer and the second insulation layer, and each of the plurality of second pattern regions may comprise only the second insulation layer of the first insulation layer and the second insulation layer, or may comprise a region from which all of the first insulation layer and the second insulation layer have been removed.

According to one or more embodiments of the present disclosure, the phase grating portion may comprise a plurality of first pattern regions, each of which overlaps at least a portion of a corresponding concave portion of the plurality of concave portions, and a plurality of second pattern region between the plurality of first pattern regions, respectively, each of the plurality of first pattern regions may comprise all of the first insulation layer and the second insulation layer, and each of the plurality of second pattern regions may comprise only the second insulation layer of the first insulation layer and the second insulation layer, or may comprise a region from which all of the first insulation layer and the second insulation layer have been removed.

According to one or more embodiments of the present disclosure, the first pattern region may comprise a circular shape, an oval shape, a three or more-angled polygonal shape, or a same shape as a shape of the concave portion, or the first pattern region may have a same size as a size of the concave portion, or may have a size which is smaller than a size of the concave portion.

According to one or more embodiments of the present disclosure, the phase grating portion may comprise a plurality of first pattern regions, each of which overlaps the convex portion, and a second pattern region between the plurality of first pattern regions.

According to one or more embodiments of the present disclosure, each of the plurality of first pattern regions PR1 is configured to overlap one or more of corner portions of the convex portion.

According to one or more embodiments of the present disclosure, the emission area of each of the plurality of subpixels may comprise a plurality of division regions, and the phase grating portion may be configured at each of the plurality of division regions.

According to one or more embodiments of the present disclosure, the plurality of division regions may be disposed along one or more direction of a first direction, a second direction intersecting with the first direction, and a diagonal direction between the first direction and the second direction.

According to one or more embodiments of the present disclosure, each of the plurality of division regions may include a tetragonal shape or a triangular shape.

According to one or more embodiments of the present disclosure, the emission area of each of the plurality of subpixels may comprise first to fourth division regions, and the phase grating portion may comprise one or more first pattern regions and one or more second pattern regions configured at each of the first to fourth division regions.

According to one or more embodiments of the present disclosure, the emission area of each of the plurality of subpixels may comprise a first division region and a second division region, and the first division region may be configured with only the first pattern region, and the second division region may be configured with only the second pattern region.

According to one or more embodiments of the present disclosure, the one or more first pattern regions may comprise all of the first insulation layer and the second insulation layer, and the one or more second pattern regions may comprise only the second insulation layer of the first insulation layer and the second insulation layer, or comprises a region from which all of the first insulation layer and the second insulation layer have been removed.

According to one or more embodiments of the present disclosure, the light extraction patterns at each of the plurality of subpixels may have a structure which has rotated about a reference point within a corresponding emission area, and one or more of the light extraction patterns at each of the plurality of subpixels may have rotated by different angles.

According to one or more embodiments of the present disclosure, a rotation angle of the light extraction pattern at each of the plurality of subpixels may differ from each other by pixel units.

According to one or more embodiments of the present disclosure, each of the plurality of concave portions or the convex portion may have a planar structure having a hexagonal shape or a honeycomb shape; and a rotation angle of the light extraction pattern may be greater than 0 degrees and smaller than 60 degrees.

According to one or more embodiments of the present disclosure, the organic light emitting display apparatus may further comprise a color filter layer between the light extraction pattern and the phase grating portion.

The organic light emitting display apparatus according to an embodiment of the present disclosure can be applied to various electronic apparatuses. For example, the organic light emitting display apparatus according to an embodiment of the present disclosure can be applied to mobile devices, video phones, smart watches, watch phones, wearable devices, foldable devices, rollable devices, bendable devices, flexible devices, curved devices, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, and home appliances, or the like.

It will be apparent to those skilled in the art that various modifications and variations can be made in the organic light emitting display apparatus of the present disclosure without departing from the spirit or scope of the disclosures. Thus, it is intended that the present disclosure cover the modifications and variations of this disclosure provided they come within the scope of the appended claims and their equivalents.

What is claimed is:

1. An organic light emitting display apparatus, comprising:

a plurality of pixels on a substrate, each including a plurality of subpixels each having an emission area;

a planarization layer including a light extraction pattern which is at the emission area of each of the plurality of subpixels and includes a plurality of concave portions and a convex portion surrounding each of the plurality of concave portions;

a light emitting device layer on the light extraction pattern; and a phase grating portion between the substrate and the light extraction pattern to overlap the emission area of each of the plurality of subpixels.

2. The organic light emitting display apparatus of claim 1, wherein:

the phase grating portion comprises a plurality of pattern regions configured to change a light path and/or a phase of reflection light reflected from the light extraction pattern based on a refractive index difference or a dielectric constant difference.

3. The organic light emitting display apparatus of claim 2, wherein:

the plurality of pattern regions have a refractive index difference therebetween.

4. The organic light emitting display apparatus of claim 3, wherein:

the plurality of pattern regions have a refractive index difference of 0.1 or more therebetween.

5. The organic light emitting display apparatus of claim 1, further comprising an insulation layer between the substrate and the light extraction pattern, wherein the phase grating portion is configured at the insulation layer.

6. The organic light emitting display apparatus of claim 5, wherein the insulation layer comprises:

a first insulation layer having a first refractive index; and a second insulation layer having a second refractive index which differs from the first refractive index, the second insulation layer being stacked on the first insulation layer.

7. The organic light emitting display apparatus of claim 6, wherein:

the phase grating portion comprises a first pattern region and a second pattern region, the first pattern region comprises all of the first insulation layer and the second insulation layer, and the second pattern region comprises only the second insulation layer of the first insulation layer and the second insulation layer, or comprises a region from which all of the first insulation layer and the second insulation layer have been removed.

8. The organic light emitting display apparatus of claim 7, wherein first insulation layers of the first pattern region respectively at the plurality of subpixels have different thicknesses.

9. The organic light emitting display apparatus of claim 7, wherein:

the second pattern region comprises only the second insulation layer, and the second insulation layer contacts the substrate at the second pattern region.

10. The organic light emitting display apparatus of claim 7, further comprising a passivation layer between the insulation layer and the light extraction pattern, wherein the second pattern region comprises a region from which all of the first insulation layer and the second insulation layer have been removed, and wherein the passivation layer contacts the substrate at the second pattern region.

11. The organic light emitting display apparatus of claim 6, wherein the phase grating portion comprises:

a plurality of first pattern regions disposed in a grating pattern shape; and a plurality of second pattern regions between the plurality of first pattern regions, respectively, wherein each of the plurality of first pattern regions comprises all of the first insulation layer and the second insulation layer, and wherein each of the plurality of second pattern regions comprises only the second insulation layer of the first insulation layer and the second insulation layer, or comprises a region from which all of the first insulation layer and the second insulation layer have been removed.

12. The organic light emitting display apparatus of claim 6, wherein the phase grating portion comprises:

a plurality of first pattern regions, each of which overlaps at least a portion of a corresponding concave portion of the plurality of concave portions; and a plurality of second pattern regions between the plurality of first pattern regions, respectively, wherein each of the plurality of first pattern regions comprises all of the first insulation layer and the second insulation layer, and wherein each of the plurality of second pattern regions comprises only the second insulation layer of the first insulation layer and the second insulation layer, or comprises a region from which all of the first insulation layer and the second insulation layer have been removed.

13. The organic light emitting display apparatus of claim 12, wherein:

the first pattern region comprises a circular shape, an oval shape, a three or more-angled polygonal shape, or a same shape as a shape of the concave portion, or the first pattern region has a same size as a size of the concave portion, or has a size which is smaller than a size of the concave portion.

14. The organic light emitting display apparatus of claim 6, wherein the phase grating portion comprises:

a plurality of first pattern regions, each of which overlaps the convex portion; and a second pattern region between the plurality of first pattern regions.

15. The organic light emitting display apparatus of claim 14, wherein:

each of the plurality of first pattern regions is configured to overlap one or more of corner portions of the convex portion.

16. The organic light emitting display apparatus of claim 6, wherein:

the emission area of each of the plurality of subpixels comprises a plurality of division regions, and the phase grating portion is configured at each of the plurality of division regions.

17. The organic light emitting display apparatus of claim 16, wherein the plurality of division regions are disposed along one or more direction of a first direction, a second direction intersecting with the first direction, and a diagonal direction between the first direction and the second direction.

18. The organic light emitting display apparatus of claim 17, wherein each of the plurality of division regions includes a tetragonal shape or a triangular shape.

19. The organic light emitting display apparatus of claim 6, wherein:

the emission area of each of the plurality of subpixels comprises first to fourth division regions, and the phase grating portion comprises one or more first pattern regions and one or more second pattern regions configured at each of the first to fourth division regions.

20. The organic light emitting display apparatus of claim 6, wherein:

the emission area of each of the plurality of subpixels comprises a first division region and a second division region, and the first division region is configured with only the first pattern region, and the second division region is configured with only the second pattern region.

21. The organic light emitting display apparatus of claim 20, wherein:

the one or more first pattern regions comprise all of the first insulation layer and the second insulation layer, and the one or more second pattern regions comprise only the second insulation layer of the first insulation layer and the second insulation layer, or comprises a region from which all of the first insulation layer and the second insulation layer have been removed.

22. The organic light emitting display apparatus of claim 1, wherein:

the light extraction patterns at each of the plurality of subpixels have a structure which has rotated about a reference point within a corresponding emission area, and one or more of the light extraction patterns at each of the plurality of subpixels have rotated by different angles.

23. The organic light emitting display apparatus of claim 22, wherein a rotation angle of the light extraction pattern at each of the plurality of subpixels differs from each other by pixel units.

24. The organic light emitting display apparatus of claim 22, wherein:

each of the plurality of concave portions or the convex portion has a planar structure having a hexagonal shape or a honeycomb shape; and a rotation angle of the light extraction pattern is greater than 0 degrees and smaller than 60 degrees.

25. The organic light emitting display apparatus of claim 1, further comprising a color filter layer between the light extraction pattern and the phase grating portion.

* * * * *